(12) United States Patent
Kuech et al.

(10) Patent No.: US 10,190,234 B1
(45) Date of Patent: Jan. 29, 2019

(54) CONTINUOUS SYSTEM FOR FABRICATING MULTILAYER HETEROSTRUCTURES VIA HYDRIDE VAPOR PHASE EPITAXY

(71) Applicant: Wisconsin Alumni Research Foundation, Madison, WI (US)

(72) Inventors: Thomas Francis Kuech, Madison, WI (US); James Blake Rawlings, Madison, WI (US); Min Yao, Madison, WI (US)

(73) Assignee: Wisconsin Alumni Research Foundation, Madison, WI (US)

( * ) Notice: Subject to any disclaimer, the term of this patent is extended or adjusted under 35 U.S.C. 154(b) by 0 days.

(21) Appl. No.: 15/797,683

(22) Filed: Oct. 30, 2017

(51) Int. Cl.
*C30B 25/10* (2006.01)
*C30B 25/08* (2006.01)
(Continued)

(52) U.S. Cl.
CPC .............. *C30B 25/08* (2013.01); *C30B 25/10* (2013.01); *C30B 25/14* (2013.01); *C30B 25/165* (2013.01); *C30B 29/42* (2013.01); *C30B 29/44* (2013.01)

(58) Field of Classification Search
CPC ....... C30B 25/08; C30B 25/10; C30B 25/165; C30B 29/44
See application file for complete search history.

(56) References Cited

U.S. PATENT DOCUMENTS 4,504,329 A 3/1985 Quinlan et al.
6,706,119 B2 3/2004 Tsvetkov et al.
(Continued)

OTHER PUBLICATIONS

Yao et al., Intensification of the Hydride Vapor Phase Epitaxy Manufacturing Process for Solar Devices, Abstract for 2017 AIChE Annual Meeting, Minneapolis, MN, Apr. 17, 2017.
(Continued)

*Primary Examiner* — Robert M Kunemund
(74) *Attorney, Agent, or Firm* — Bell & Manning, LLC

(57) ABSTRACT

A Hydride Vapor Phase Epitaxy (HVPE) system is provided which comprises a deposition assembly comprising a plurality of deposition chambers and a plurality of separation chambers mounted together, each separation chamber having two opposing ends, each end mounted to a deposition chamber of the plurality of deposition chambers and in fluid communication with the deposition chamber via a fluid pathway, wherein each deposition chamber of the plurality of deposition chambers defines a deposition zone having a height $h_d$, each separation chamber defines a separation zone having a height $h_s$ and a length $l_s$, and each fluid pathway has a height $h_{fp}$, wherein $h_{fp}$, $h_s$ and $l_s$ are selected to provide a predetermined interfacial transition region value between different material layers of a multilayer heterostructure; and a moveable belt configured to continuously convey a substrate mounted thereon through the plurality of deposition chambers and the plurality of separation chambers. The system further comprises a gas delivery assembly configured to deliver reactant gas mixtures to the deposition assembly for deposition on the substrate via HVPE.

20 Claims, 23 Drawing Sheets

(51) Int. Cl.
*C30B 29/44* (2006.01)
*C30B 25/16* (2006.01)
*C30B 29/42* (2006.01)
*C30B 25/14* (2006.01)

(56) References Cited

U.S. PATENT DOCUMENTS

2010/0151129 A1  6/2010  Schmid et al.
2010/0210769 A1* 8/2010  Hayashi ............... C08F 8/42
                                            524/261
2010/0310769 A1  12/2010 Armour et al.
2013/0309848 A1  11/2013 Young et al.
2015/0325430 A1* 11/2015 Young .................. C30B 25/08
                                            438/478

OTHER PUBLICATIONS

Yao et al., Modeling of Transport and Reaction in a Novel Hydride Vapor Phase Epitaxy System, Abstract for 2017 AlChE Annual Meeting, Minneapolis, MN, Apr. 17, 2017.

* cited by examiner

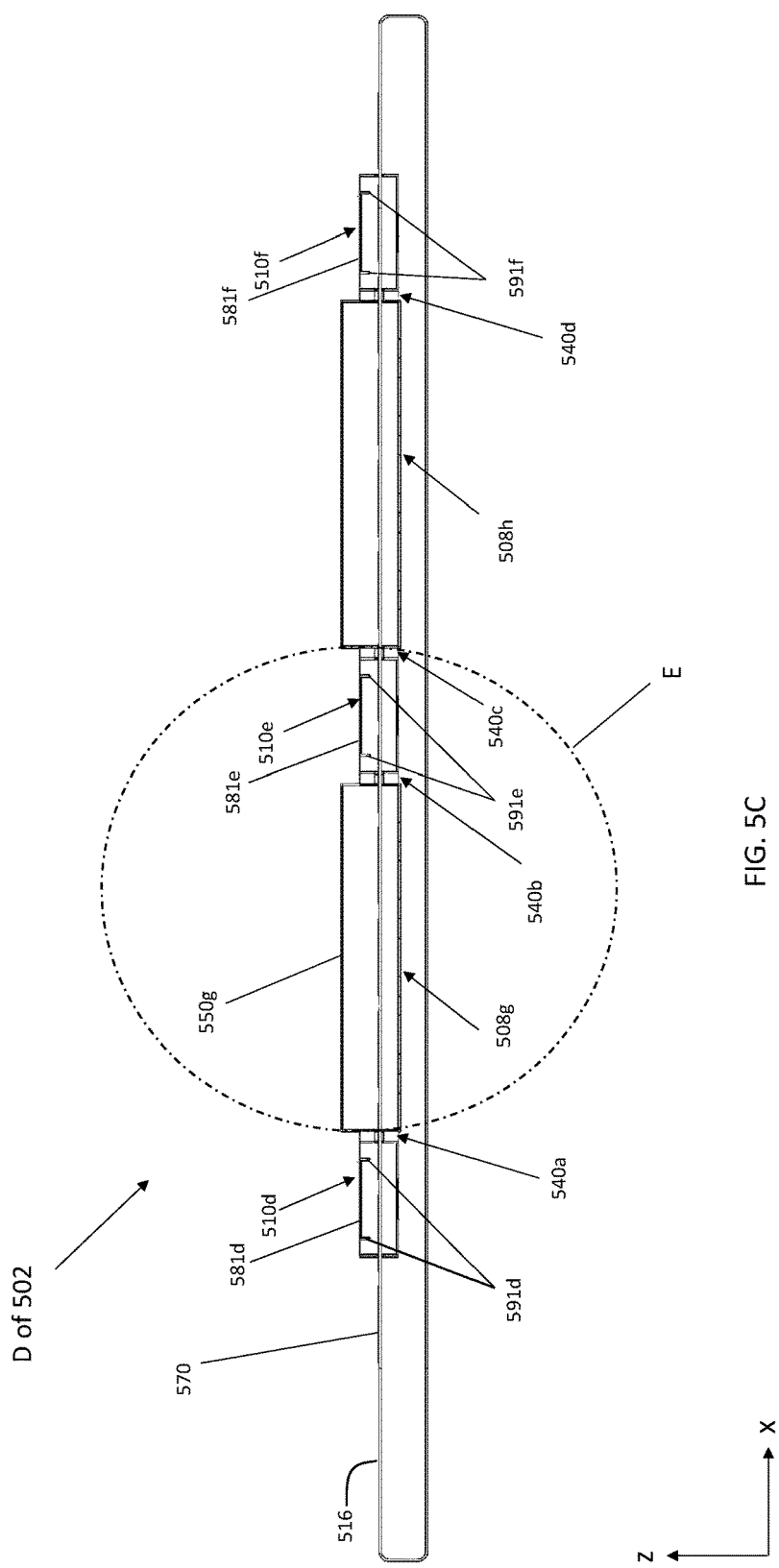

CONTINUOUS SYSTEM FOR FABRICATING MULTILAYER HETEROSTRUCTURES VIA HYDRIDE VAPOR PHASE EPITAXY

REFERENCE TO GOVERNMENT RIGHTS

This invention was made with government support under 1232618 awarded by the National Science Foundation. The government has certain rights in the invention.

BACKGROUND

Group III-V photovoltaic devices have demonstrated high solar conversion efficiencies. (See, e.g., M. A. Green et al., "Solar Cell Efficiency Tables (version 49)," *Prog. Photovolt. Res. Appl.*, vol. 25, no. 1, pp. 3-13, January 2017.) However, their widespread use is significantly limited due to the considerable expense of fabrication methods (typically metalorganic vapor phase epitaxy) and materials. Various strategies have been applied to lower the cost of these devices, including designing ultrathin solar cells modified with nanostructures (S.-M. Lee et al., "High Performance Ultrathin GaAs Solar Cells Enabled with Heterogeneously Integrated Dielectric Periodic Nanostructures," *ACS Nano*, vol. 9, no. 10, pp. 10356-10365, October 2015), epitaxial lift-off (ELO) techniques to recycle substrates (C.-W. Cheng, K.-T. Shiu, N. Li, S.-J. Han, L. Shi, and D. K. Sadana, "Epitaxial Lift-off Process for Gallium Arsenide Substrate Reuse and Flexible Electronics," *Nat. Commun.*, vol. 4, p. ncomms2583, March 2013), and smarter light management. However, any advantages afforded by these strategies have a limited effect in the mass production of group III-V photovoltaics since the underlying epitaxial method exhibits a low growth rate.

Hydride vapor phase epitaxy (HVPE) is a growth technique offering a higher growth rate and less expensive reactants. However, this advantage has not translated into the practical use of HVPE to produce group III-V photovoltaics due to a number of technical challenges. These challenges are based upon the fact that HVPE is a near-to-equilibrium growth process, which makes the growth of individual layers, and thus the quality of the interfaces between adjacent material layers, very difficult to control.

SUMMARY

The present disclosure is directed to a system for fabricating multilayer heterostructures via HVPE.

In one aspect, HVPE systems are provided. In an embodiment, a HVPE system comprises a deposition assembly comprising a plurality of deposition chambers and a plurality of separation chambers mounted together, each separation chamber having two opposing ends, each end mounted to a deposition chamber of the plurality of deposition chambers and in fluid communication with the deposition chamber via a fluid pathway, wherein each deposition chamber of the plurality of deposition chambers defines a deposition zone having a height $h_d$, each separation chamber defines a separation zone having a height $h_s$ and a length $l_s$, and each fluid pathway has a height $h_{fp}$, wherein $h_{fp}$, $h_s$ and $l_s$ are selected to provide a predetermined interfacial transition region value between different material layers of a multilayer heterostructure; and a moveable belt configured to continuously convey a substrate mounted thereon through the plurality of deposition chambers and the plurality of separation chambers. The system further comprises a gas delivery assembly configured to deliver reactant gas mixtures to the deposition assembly for deposition on the substrate via HVPE.

In another aspect, methods of using the HVPE systems are provided. In an embodiment, a method of fabricating multilayer heterostructures via HVPE using the HVPE described above comprises delivering a first reactant gas mixture to a first deposition chamber of the plurality of deposition chambers while conveying the substrate through the first deposition chamber to deposit a first material layer on the substrate via HVPE; conveying the substrate through a first separation chamber of the plurality of separation chambers; delivering a second reactant gas mixture to a second deposition chamber of the plurality of deposition chambers while conveying the substrate through the second deposition chamber to deposit a second material layer on the first material layer via HVPE; conveying the substrate through a second separation chamber of the plurality of separation chambers; and optionally, delivering one or more additional reactant gas mixtures to one or more additional deposition chambers of the plurality of deposition chambers while conveying the substrate through the one or more additional deposition chambers to deposit one or more additional material layers via HVPE.

Other principal features and advantages of the invention will become apparent to those skilled in the art upon review of the following drawings, the detailed description, and the appended claims.

BRIEF DESCRIPTION OF THE DRAWINGS

Illustrative embodiments of the invention will hereafter be described with reference to the accompanying drawings, wherein like numerals denote like elements.

FIG. 5C shows a cross-sectional view of the portion of the deposition assembly of FIG. 5B.

DETAILED DESCRIPTION

Figure 1:
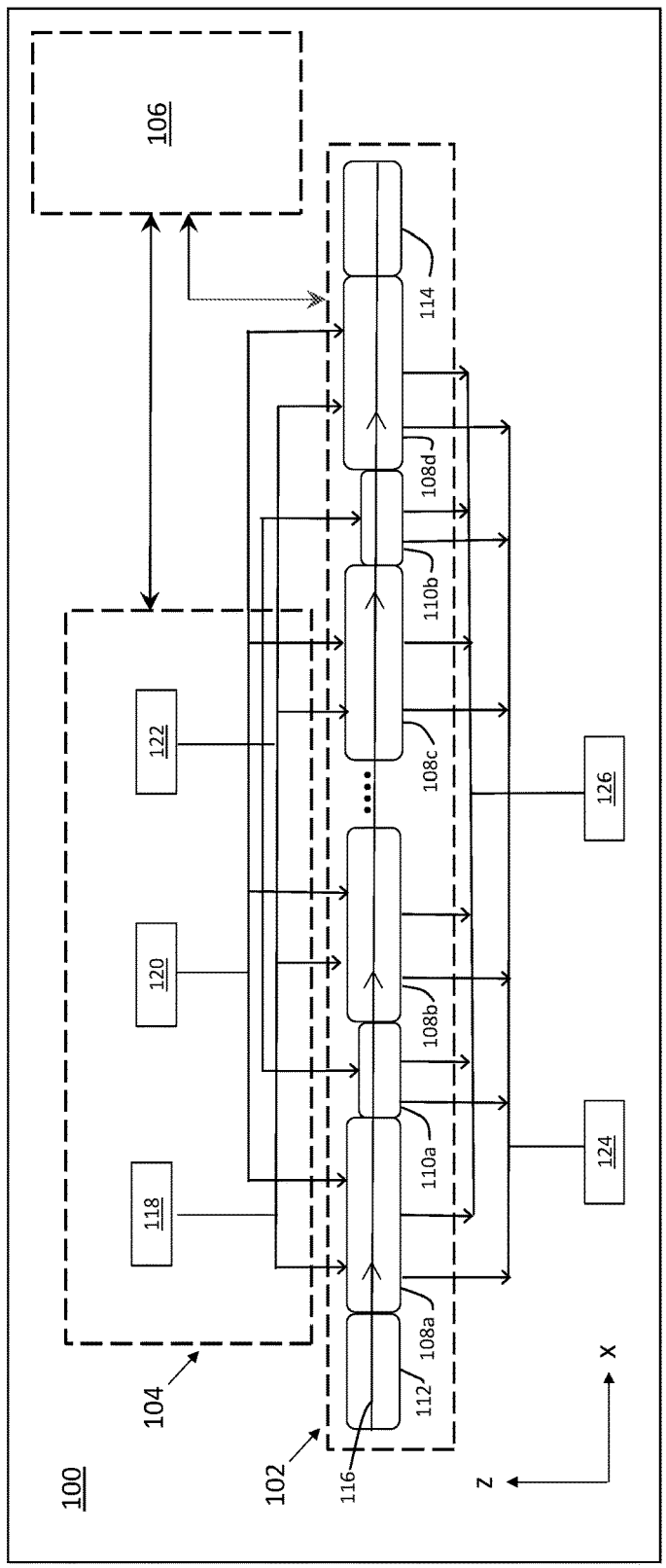
FIG. 1 shows a side-view of a block diagram of a system for fabricating multilayer heterostructures via HVPE according to an illustrative embodiment.

The present disclosure is directed to a system for fabricating multilayer heterostructures via HVPE. FIG. 1 shows a side-view of a block diagram of a HVPE system 100 for fabricating multilayer heterostructures according to an illustrative embodiment. The HVPE system 100 includes a deposition assembly 102, a gas delivery assembly 104 and a control assembly 106.

The deposition assembly 102 comprises a plurality of deposition chambers (including deposition chambers 108a-d) and a plurality of separation chambers (including separation chambers 110a-b) mounted together. In this embodiment, the deposition and separation chambers 108a-d, 110a-b are mounted to one another and arranged in a linear array, defining a longitudinal axis of the deposition assembly 102 which extends parallel to the x-axis shown in FIG. 1. Other arrangements beside a linear array may be used. Each deposition chamber defines a deposition zone in its interior which may be filled with reactant gases (from the gas delivery assembly 104) for forming an individual material layer of the multilayer heterostructure on a substrate positioned within the interior. Each separation chamber defines a separation zone in its interior from which reactant gases from adjacent deposition chambers may be excluded so as to isolate the chemical atmosphere of one deposition chamber from the chemical atmosphere of another deposition chamber. Although the separation chambers isolate deposition chambers from one another, as further described below, separation chambers are in fluid communication with adjacent deposition chambers via fluid pathways that connect the chambers.

In the embodiment of FIG. 1, deposition chambers 108a and 108b are separated by the separation chamber 110a, and deposition chambers 108c and 108d are separated by the separation chamber 110b. However, other arrangements may be used, e.g., two or more deposition chambers may be mounted together and arranged in series (to form an extended deposition zone), followed by a separation chamber, followed by a single deposition chamber or another set of deposition chambers mounted together and arranged in series. In addition, the number of deposition and separation chambers in the HVPE system 100 is not particularly limited, but depends upon the desired number of material layers in the multilayer heterostructure to be deposited as well as the desired thickness of those material layers. Thus, the " . . . " in FIG. 1 indicates the optional placement of additional deposition and separation chambers in the deposition assembly 102. As such, the HVPE system 100 is highly flexible and may be used to fabricate a variety of multilayer structures having layers of different compositions and thicknesses. Adjacent chambers may be mounted together via seals and/or connectors, as further described below.

The deposition assembly 102 may comprise other chambers mounted to the linear array of deposition and separation chambers. As shown in FIG. 1, a preheat chamber 112 may be mounted to a first chamber (e.g., the deposition chamber 108a) to heat the substrate from room temperature to an initial temperature prior to entry into the deposition chamber 108a. Similarly, a cool-down chamber 114 may be mounted to a last chamber (e.g., deposition chamber 108d) to cool the substrate to room temperature prior to unloading it from the deposition assembly 102. Separation chambers may be mounted between the preheat chamber 112 and the deposition chamber 108a and between the cool-down chamber 114 and the deposition chamber 108d.

The deposition assembly 102 further comprises a moveable belt 116 configured to continuously convey substrates along a deposition pathway that extends longitudinally through the deposition assembly 102. The direction of movement is indicated with arrows along the moveable belt 116. By "continuous" it is meant that the moveable belt 116 is configured to move substrates mounted thereon along the deposition pathway without stopping along the way. This may be accomplished by operably coupling the moveable belt 116 to an appropriate drive system and the control assembly 106. The moveable belt 116 may move through the deposition assembly 102 at a constant speed or the speed may vary depending upon the longitudinal position of the substrate along the deposition pathway.

The HVPE system 100 may comprise other chambers and components configured to load bare substrates into the deposition assembly 102 and to unload as-deposited substrates out of the deposition assembly 102. Such other chambers/components (not shown) may include a load lock chamber with a robotic arm mounted to the preheat chamber 112 and another load lock chamber with another robotic arm mounted to the cool-down chamber 114.

The gas delivery assembly 104 is operably coupled to the deposition system 102. The gas delivery assembly 104 is configured to generate and/or deliver certain gases to the chambers of the deposition assembly 102. The gases, and thus, the particular components of the gas delivery assembly 104, depend upon the composition of the materials of the multilayer heterostructure to be deposited. By way of illustration, to form a layer of GaAs via HVPE, a halide gas (e.g., HCl) may be flowed over a source of Ga (e.g., pure Ga) to form gaseous GaCl. The GaCl may be combined with a source of As (e.g., $AsH_3$ or elemental As from a suitable source chamber), and a carrier gas (e.g., $H_2$) and to form a reactant gas mixture 118 at a selected pressure and a selected temperature for delivery at a selected flow rate to a deposition zone of a selected deposition chamber(s). Thus, the gas delivery assembly 104 may include the various components (e.g., gas manifold, source containers/chambers, mixing chambers, heaters, etc.) to generate and/or deliver the reactant gas mixture 118 to one or more of the deposition chambers via inlet ports mounted to the deposition chambers.

The gas delivery assembly 104 may be configured to generate and/or deliver multiple types of reactant gases or gas mixtures, e.g., another reactant gas mixture 120. The gas delivery assembly 104 may be configured to deliver inert gases 122 (e.g., Ar, $H_2$) which may be used as purge and/or carrier gases for the deposition chambers and separation chambers. The gas delivery assembly 104 may be configured to deliver other types of gases to one or more separation chambers. These other gases may have composition selected to suppress the loss of volatile components from a deposited material layer. By way of illustration, a flow of $AsH_3$ may be delivered to a separation chamber to prevent the loss of As from a substrate having a layer of GaAs deposited thereon as the deposited layer is conveyed through the separation chamber. The arrows shown in FIG. 1 connecting the various gases/gas mixtures to chambers of the deposition system 102 are illustrative and not meant to be limiting.

The control assembly 106 is operably coupled to both the gas delivery assembly 104 and the deposition assembly 102 and is configured to control certain components of these assemblies. By way of illustration, the control assembly 106 may be configured to control the motion and speed of the moveable belt 116; control the flow rate of gases delivered by gas delivery assembly 104; and direct the delivery of the gases to selected deposition/separation chambers. The control assembly 106 may also be configured to control the temperature of the deposition and separation chambers, which may be heated via various types of heaters (not shown). The control assembly 106 may include one or more sensors, e.g., gas flow sensors, temperature sensors, etc., to monitor these parameters.

The control assembly 106 may be integrated into the HVPE system 100 as part of a single device or its functionality may be distributed across one or more devices that are connected to other system components directly or through a network that may be wired or wireless. The control assembly 106 may comprise an input interface(s), an output interface(s), a communication interface(s), a computer-readable medium (media), a processor(s), and an application(s) as is known in the art.

The input interface provides an interface for receiving information into the control assembly 106. Input interface may interface with various input technologies including, e.g., a keyboard, a display, a mouse, a keypad, etc. to allow a user to enter information into the control assembly 106 or to make selections presented in a user interface displayed on the display. Input interface further may provide the electrical connections that provide connectivity between the controller and other components of the HVPE system 100.

The output interface provides an interface for outputting information from the control assembly 106. For example, output interface may interface with various output technologies including, e.g., the display or a printer for outputting information for review by the user. Output interface may further provide an interface for outputting information to other components of the HVPE system 100.

The communication interface provides an interface for receiving and transmitting data between devices using various protocols, transmission technologies, and media. Communication interface may support communication using various transmission media that may be wired or wireless. Data and messages may be transferred between the controller, the database, other components of the HVPE system 100 and/or other external devices using communication interface.

The computer-readable medium is an electronic holding place or storage for information so that the information can be accessed by the processor of the control assembly 106. Computer-readable medium can include any type of random access memory (RAM), any type of read only memory (ROM), any type of flash memory, etc. such as magnetic storage devices, optical disks, smart cards, flash memory devices, etc.

The processor executes instructions. The instructions may be carried out by a special purpose computer, logic circuits, or hardware circuits. Thus, the processor may be implemented in hardware, firmware, or any combination of these methods and/or in combination with software. The term "execution" is the process of running an application or the carrying out of the operation called for by an instruction. The instructions may be written using one or more programming language, scripting language, assembly language, etc. Processor executes an instruction, meaning that it performs/controls the operations called for by that instruction. Processor operably couples with the input interface, with the output interface, with the computer-readable medium, and with the communication interface to receive, to send, and to process information. Processor may retrieve a set of instructions from a permanent memory device and copy the instructions in an executable form to a temporary memory device that is generally some form of RAM.

The application performs operations associated with controlling other components of the HVPE system 100. Some or all of the operations described in the present disclosure may be controlled by instructions embodied in the application. The operations may be implemented using hardware, firmware, software, or any combination of these methods. In embodiments, the application is implemented in software (comprised of computer-readable and/or computer-executable instructions) stored in the computer-readable medium and accessible by the processer for execution of the instructions that embody the operations of application. The application may be written using one or more programming languages, assembly languages, scripting languages, etc.

Thus, in embodiments, the control assembly 106 may comprise a processor and a non-transitory computer-readable medium operably coupled to the processor, the computer-readable medium comprising instructions that, when executed by the processor, cause components of the HVPE system 100 to carry out certain operations. These operations may include setting/adjusting the speed of the moveable belt 116, including varying the speed depending upon the longitudinal position of the substrate along the deposition pathway; setting/adjusting the flow rate of gases delivered by gas delivery assembly 104 to selected deposition/separation chambers; setting/adjusting the temperature of the deposition and separation chambers; etc.

A feature of at least some embodiments of the HVPE system 100 is that the deposition assembly 102 is configured to operate at a single temperature across the deposition/separation chambers of the deposition assembly 102. That is, the temperature of each of the deposition/separation chambers may be the same. By "same" it is meant substantially the same, rather than exactly the same. The temperature of each of the deposition/separation chambers may be selected to minimize a temperature gradient across the substrate so as to minimize or prevent formation of defects or cracking. In embodiments, the temperature of each of the deposition/separation chambers is within ±10%, ±5%, ±2%, etc. of each other. This includes embodiments in which different deposition chambers may be depositing different material layers but the temperatures of the different deposition chambers are the same. This is a departure from conventional HVPE methods which independently optimize the temperature depending upon the type of material to be deposited. Operation at a single temperature across the deposition/separation chambers of the deposition assembly 102 may be accomplished by using a continuous heater operably coupled to the deposition/separation chambers under appropriate control by the control assembly 106 or by using multiple heaters operably coupled to individual deposition/separation chambers under appropriate control by the control assembly 106.

The deposition and separation chambers of the deposition assembly 102 may be operably coupled to an exhaust assembly 124 via outlet ports mounted to the chambers. The HVPE system 100 may include a cleaning assembly 126 configured to clean the moveable belt 116 after as-deposited substrates have been removed from the deposition assembly 102.

Next, the operation of the HVPE system 100 is generally described according to an illustrative embodiment. A substrate is loaded onto the moveable belt 116 in the preheat chamber 112 being held at a selected initial temperature. The substrate may be heated while being conveyed through the preheat chamber 112. As the substrate is conveyed through the deposition chamber 108a, reactant gases in the deposition zone of the deposition chamber 108a (generated and/or delivered by the gas delivery system 104 under control by the control assembly 106) form a first material layer on the surface of the moving substrate via HVPE. The thickness of the first material layer may be controlled via the flow rate of the reactant gases as well as the time the moving substrate is within the deposition zone (controllable via the speed of the moveable belt 116 and the length of the deposition zone). Next, further deposition of the reactant gases is minimized or prevented by conveying the substrate through the separation chamber 110a. In embodiments, an inert gas or a gas composition selected to suppress the loss of volatile components is flowed through the separation chamber 110a at a selected flow rate. However, in other embodiments, no gas is flowed through the separation chamber 110a. Next, as the substrate is conveyed through the deposition chamber 108b, other reactant gases in the deposition zone of the deposition chamber 108b form a second material layer on the moving substrate via HVPE. Third and fourth material layers are sequentially deposited by conveying the substrate through deposition chambers 108c, 108d. The substrate, now having the four-layer heterostructure deposited thereon, is cooled as it is conveyed through the cool-down chamber 114. The length of the cool-down chamber 114 may be sufficiently long so as to minimize the temperature gradient the deposited multilayer heterostructure experiences during cooling.

Illustrative embodiments of deposition assemblies or portions thereof are further described below with reference to FIGS. 2, 3A-3D, 5A-5D, 6A-6B, and 7A-7B. In particular, the configuration of the fluid pathway connecting adjacent deposition and separation chambers as well as the configuration of the separation chambers in order to optimize the quality of interfaces between different material layers within the multilayer heterostructure is described.

Figure 2:
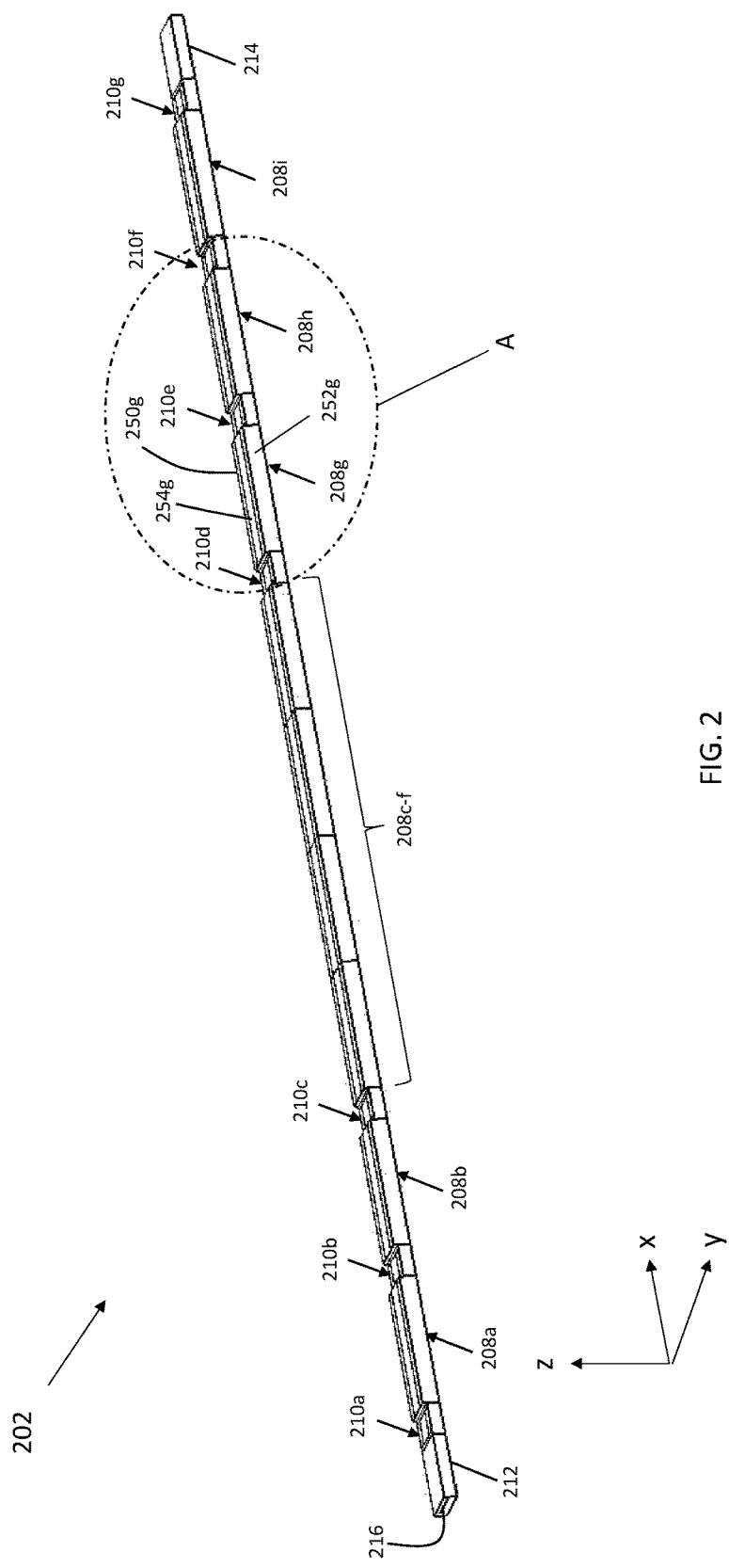
FIG. 2 shows a perspective view of a deposition assembly of the system of FIG. 1.

FIG. 2 shows a perspective view of a deposition assembly 202 comprising a preheat chamber 212, deposition chambers 208a-i, separation chambers 210a-g, a cool-down chamber 214 and a moveable belt 216 extending longitudinally through the deposition assembly 202. Deposition chambers 208c-f may be individual deposition chambers mounted together and arranged in series or a single longer deposition chamber. In this embodiment, each chamber is rectangular in shape and has a bottom wall, a top wall, and side walls extending between the bottom and top walls. However, other shapes may be used, e.g., chambers having a cylindrical shape may be used. In addition, the exact shape may be determined by considering hydrodynamics to optimize gas flow within the chambers, e.g., avoidance of vortexes, avoidance of dead zones, etc. Each top wall of deposition chambers 208a-i has formed therein a deposition inlet port through which reactant gases from the gas delivery assembly 104 may flow into the interior of the deposition chamber. In this embodiment, the deposition inlet ports are rectangular in shape. Other shapes may be used, although the shape and dimensions are generally selected to expose all (i.e., substantially all) of a top surface of a substrate being conveyed through the deposition chamber in order to ensure homogenous coverage with a desired material layer. A top wall 250g, a side wall 252g and a deposition inlet port 254g of the deposition chamber 208g is labeled for reference.

In this embodiment, each top wall of separation chambers 210a-g also has formed therein a separation inlet port through which gases may flow into the separation chamber. However, such ports are not required, i.e., a solid top wall may be used. Similarly, separation inlet ports may be included but it is not necessary that any gas flows into the associated separation chamber during operation.

Figure 3A:
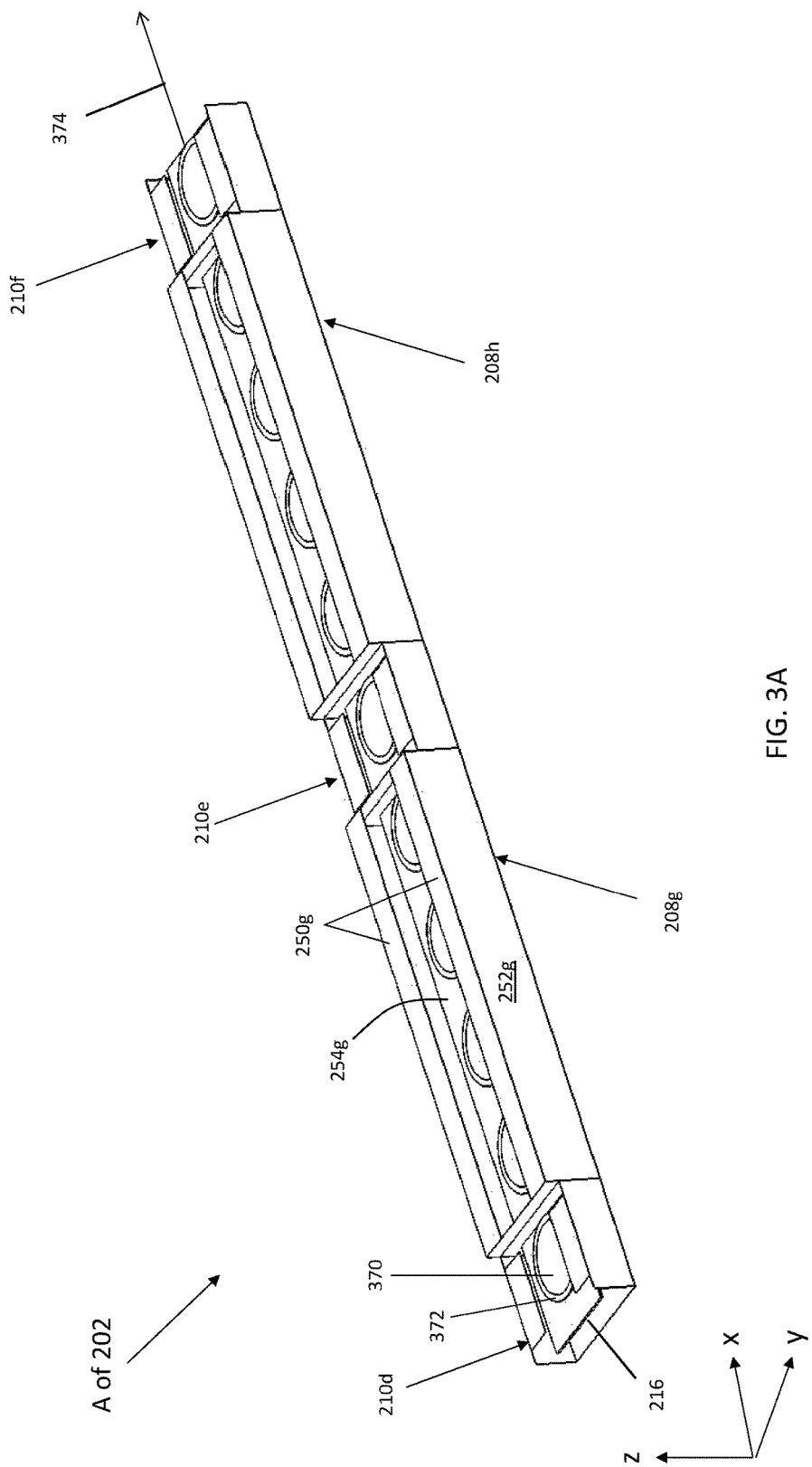
FIG. 3A shows a perspective view of a portion of the deposition assembly of FIG. 2.
Figure 3B:
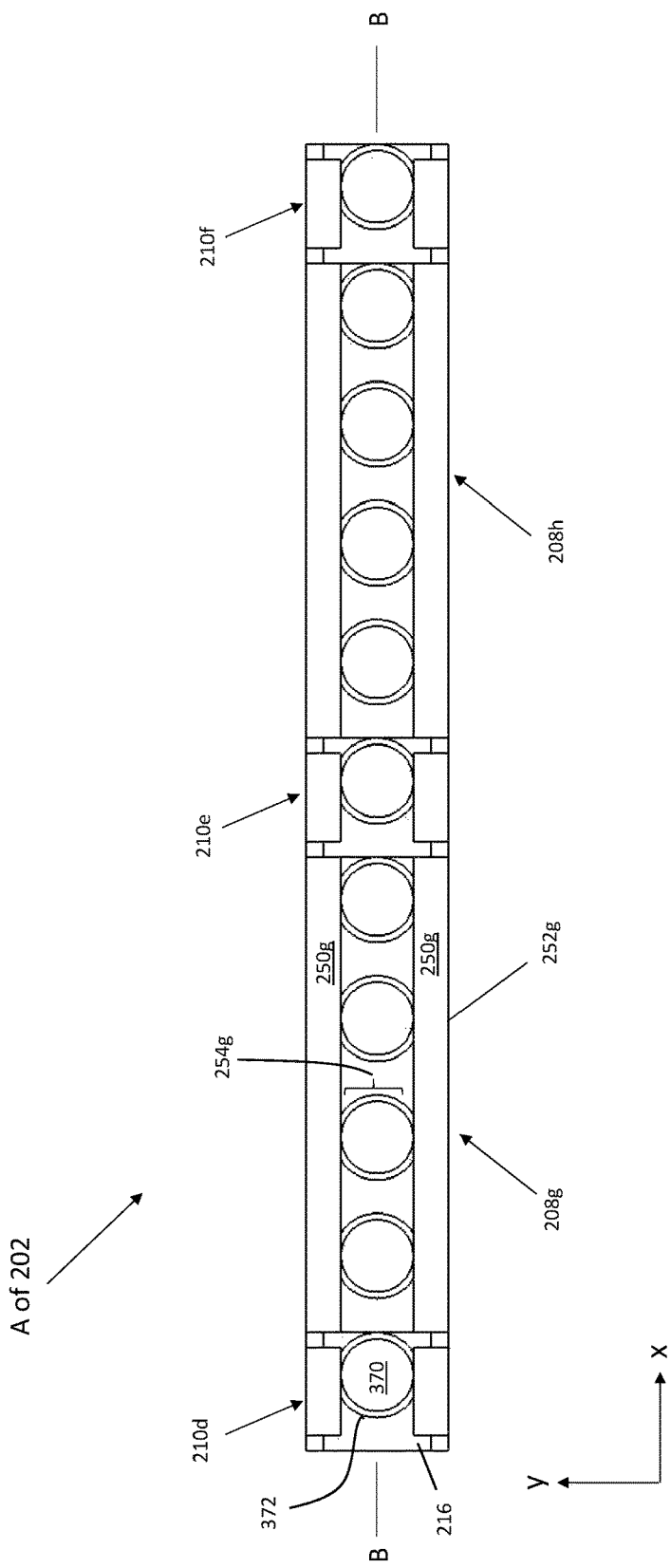
FIGS. 3B and 3C show top views of the portion of the deposition assembly of FIG. 3A.
Figure 3C:
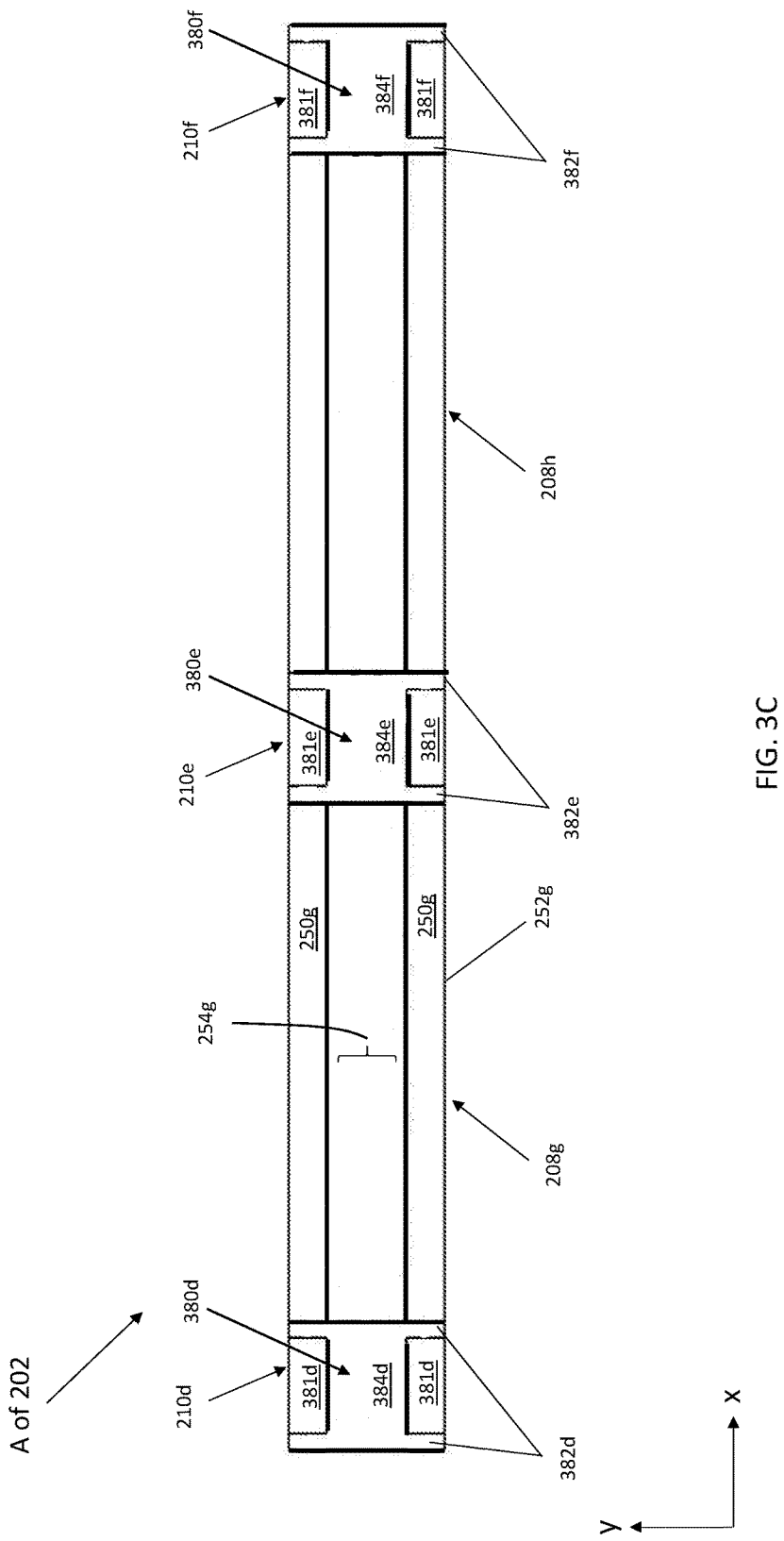
Figure 3D:
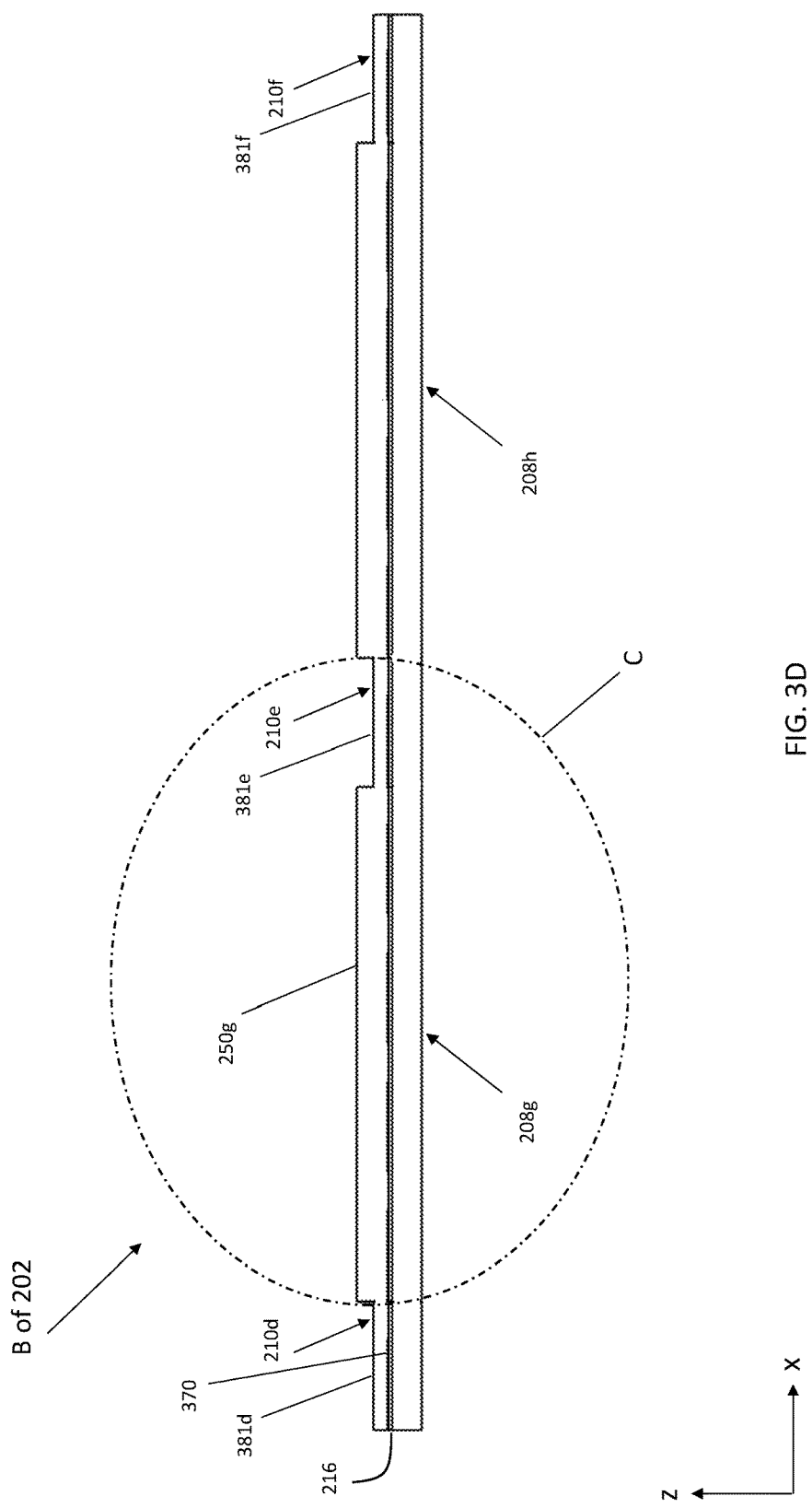
FIG. 3D shows a cross-sectional view of the portion of the deposition assembly of FIG. 3A.
Figure 3E:
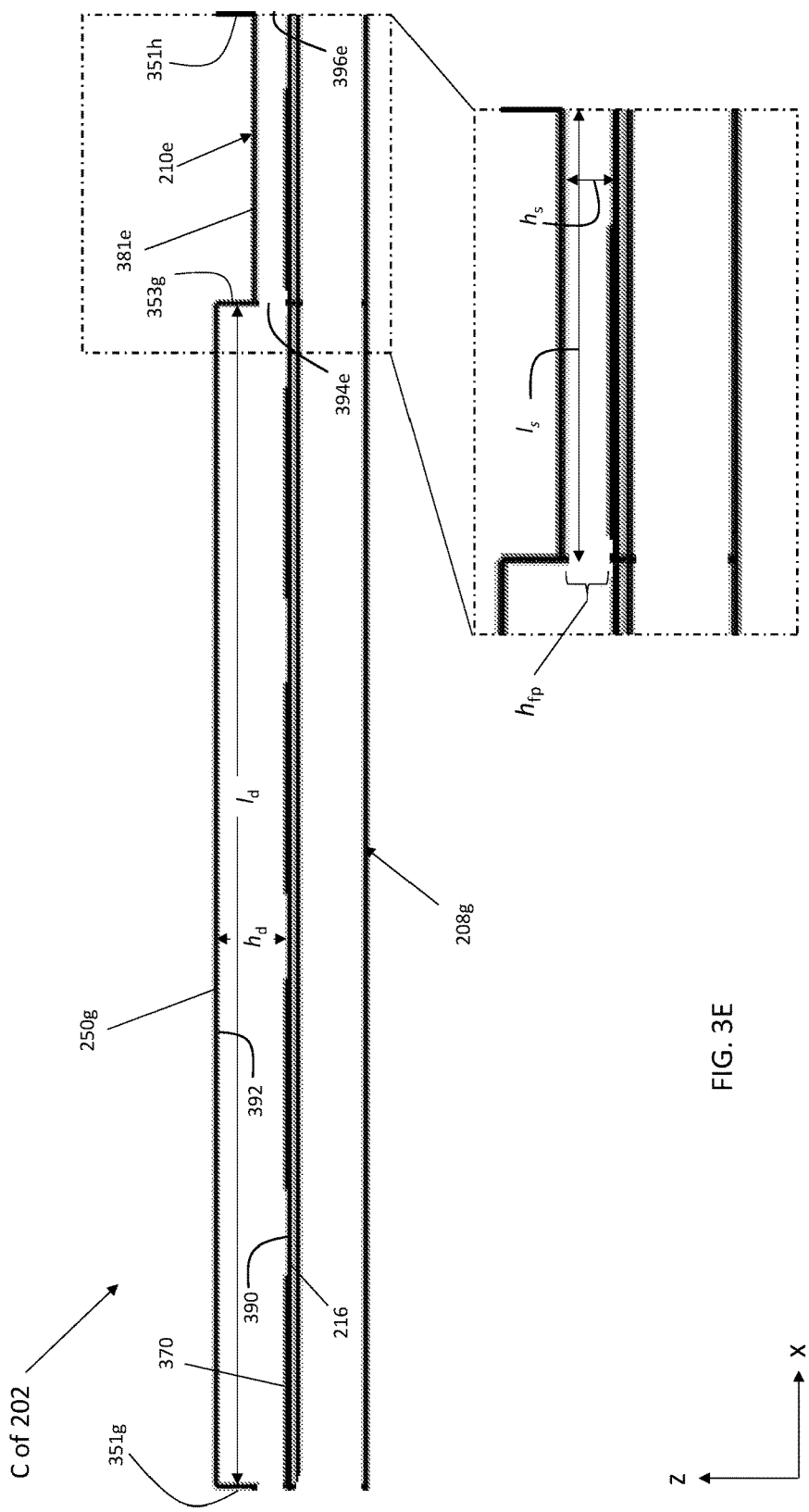
FIG. 3E shows a portion of the cross-sectional view of the portion of FIG. 3D.

FIG. 3A shows a perspective view of a portion (portion A) of the deposition assembly 202. However, this view also shows "snapshots" of a substrate 370 mounted to a substrate holder 372 as it is being conveyed along a deposition pathway via a moveable belt 216 in a direction indicated by arrow 374. Also, as will be further described below, the shape of the separation inlet ports differs from the rectangular shape of the separation inlet ports shown in FIG. 2. FIG. 3B shows a top down view of portion A. FIG. 3C shows the same top down view of portion A, with the substrate 370 and the moveable belt 216 removed to better visualize the separation inlet ports. FIG. 3D shows a side cross-sectional view of portion A taken along section B of FIG. 3B. FIG. 3E shows a side cross-sectional view of portion C of FIG. 3D.

The view of FIG. 3C shows rectangular-shaped deposition inlet ports (e.g., deposition inlet port 254g of deposition chamber 208g). Although separation chambers may have a solid top wall without any separation inlet ports, or separation inlet ports may be rectangular-shaped as shown in FIG. 2, the shape of the separation inlet ports may be selected to optimize the quality of the interface between different material layers deposited in different deposition chambers. In some embodiments, as shown in FIG. 3C, H-shaped separation inlet ports may be formed in top walls of separation chambers, e.g., H-shaped separation inlet ports 380d-f formed in top walls 381d-f. The parallel bar apertures 382d-f of the "H" shape may extend laterally across the separation chambers 210d-f (i.e., along the y-axis) with the crossbar aperture 384d-f extending longitudinally. The relative dimensions of the parallel bar apertures 382d-f and the crossbar aperture 384d-f may be selected to optimize interfacial quality. The other separation inlet ports in the deposition assembly 202 may be similarly configured.

The dimensions of the deposition and separation zones defined within the interiors of the deposition and separation chambers of the deposition assembly 202 as well as the dimensions of the fluid pathway connecting adjacent deposition and separation chambers are best viewed in FIGS. 3D-3E. In FIG. 3E, side walls 351g, 353g of the deposition chamber 280g and a side wall 351h of the deposition chamber 208h are labeled.

As noted above, "deposition zone" refers to a volume within the interior of a deposition chamber through which reactant gases may flow at a selected flow rate (or range of flow rates) for forming an individual layer of the multilayer heterostructure. A "separation zone" refers to a volume within the interior of a separation chamber from which reactant gases from adjacent deposition chambers may be excluded so as to isolate the chemical atmosphere of one deposition chamber from the chemical atmosphere of another deposition chamber. Since separation chambers and adjacent deposition chambers are in fluid communication, reactant gases from adjacent deposition chambers can diffuse into the separation chambers. The extent of the diffusion of reactant gases depends upon the selected gas flow rates in the adjacent deposition chambers as well as the selected operating temperature. Such diffusion prevents the formation of sharp interfaces formed between different material layers of the multilayer heterostructure. The present invention is based, at least in part, on the inventors' finding that despite the fluid communication between deposition and separation chambers, the physical geometry of the fluid pathway and separation zones may be selected to sufficiently exclude reactant gases from the separation zone so as to achieve extremely sharp interfaces. Although the use of gas flow through the separation chambers (i.e., the use of a gas curtain) can counteract the diffusion of gas from adjacent deposition chambers, the inventors have found that such sharp interfaces may be achieved even without flowing any gas as at all through the separation chambers.

As shown in FIG. 3E, a length of a deposition zone of the deposition chamber 208h is labeled $l_d$, which extends from the side wall 351g of the deposition chamber 208h to the opposing side wall 353g. The length $l_d$ may be selected to achieve a desired thickness of a material layer to be deposited (given a selected range of flow rates of the reactant gases delivered to the deposition chamber 208g and a selected range of speeds of the moveable belt 216). Alternatively, the length $l_d$ may be fixed to achieve a fixed thickness and multiple deposition chambers may be mounted together in series to achieve the desired thickness. A height of the deposition zone is labeled as $h_d$, which extends from a top surface 390 of the moveable belt 216 to an interior surface 392 of the top wall 250g of the deposition chamber 208h. The height $h_d$ may be selected to ensure sufficient mixing of reactant gases in the deposition zone. The specific value of $h_d$ also depends upon the configuration of the deposition inlet port of the deposition chamber. By way of illustration, a smaller $h_d$ may be used by using multiple deposition inlet ports (i.e., instead of a single deposition inlet port). A width of the deposition zone ($w_d$, not shown) may be defined as the lateral dimension taken along the y-axis from an interior surface of one side wall to an interior surface of an opposing side wall of the deposition chamber 208g. The width $w_d$ may be selected to accommodate the moveable belt 216 while maintaining a relatively narrow gap between belt edges and side walls of the deposition chamber 208g. The width $w_d$ may also be selected to accommodate multiple, side-by-side moveable belts extending parallel to one another. This is useful for scaling up the present HVPE systems and greatly increasing throughput. The dimensions of other deposition chambers/zones in the deposition assembly 202 may be similarly configured.

As noted above, separation chambers are in fluid communication with adjacent deposition chambers and reactant gases from the adjacent deposition chambers can diffuse into the separation chambers via fluid pathways that connect the chambers. As shown in FIG. 3E, a first fluid pathway 394e connects the interior of the deposition chamber 208g (left) to the interior of the separation chamber 210e. A second fluid pathway 396e connects the interior of the separation chamber 210e to the interior of the deposition chamber 208i (right, see FIG. 2). In this embodiment, the first fluid pathway 394e is a rectangular-shaped aperture defined by an interior edge of the side wall 353g of the deposition chamber 208g and the top surface 390 of the moveable belt 216. The first fluid pathway 394e extends laterally from one side wall of the deposition chamber 208g to the opposing side wall. As shown in the zoomed in portion, a height of the first fluid pathway 394e is labeled $h_{fp}$. The second fluid pathway 396e may be similarly configured.

The heights $h_{fp}$ of the fluid pathways 394e, 396e are sufficiently large so to accommodate passage of a moving substrate, i.e., so that the moving substrate can clear the fluid pathways 394e, 396e. However, $h_{fp}$ is otherwise selected to optimize interfacial quality in the multilayer heterostructure. The selected height $h_{fp}$ may depend upon the operating temperature as well as the range of flow rates used in adjacent deposition chambers 208g, 208i. In addition, the selected height $h_{fp}$ may depend upon the use of gas flow (and its rate) into the separation chamber 210e. By way of illustration, for a given operating temperature and flow rates used in the adjacent deposition chambers 208g, 208i, flowing gas into the separation chamber 210e during the passage of the substrate 370 can mean that a larger $h_{fp}$ can be tolerated while still achieving a sharp interface. However, in embodiments, $h_{fp}$ is a value which provides a headspace of no more than 2 mm above the substrate, no more than 4 mm above the substrate, no more than 6 mm above the substrate, no more than 8 mm above the substrate, or no more than 1 cm above the substrate. This includes embodiments in which $h_{fp}$ is a value which provides a headspace of no more than 1.2 cm above the substrate, no more than 1.4 cm above the substrate, no more than 1.6 cm above the substrate, no more than 1.8 cm above the substrate, or no more than 2 cm above the substrate. By "headspace" it is meant the clearance between the interior edge of the side wall 353g (i.e., the same point from which $h_{fp}$ is determined) of the deposition chamber 208g and the top surface of the substrate 370 (rather than the top surface 390 of the moveable belt 216.

Figure 8:
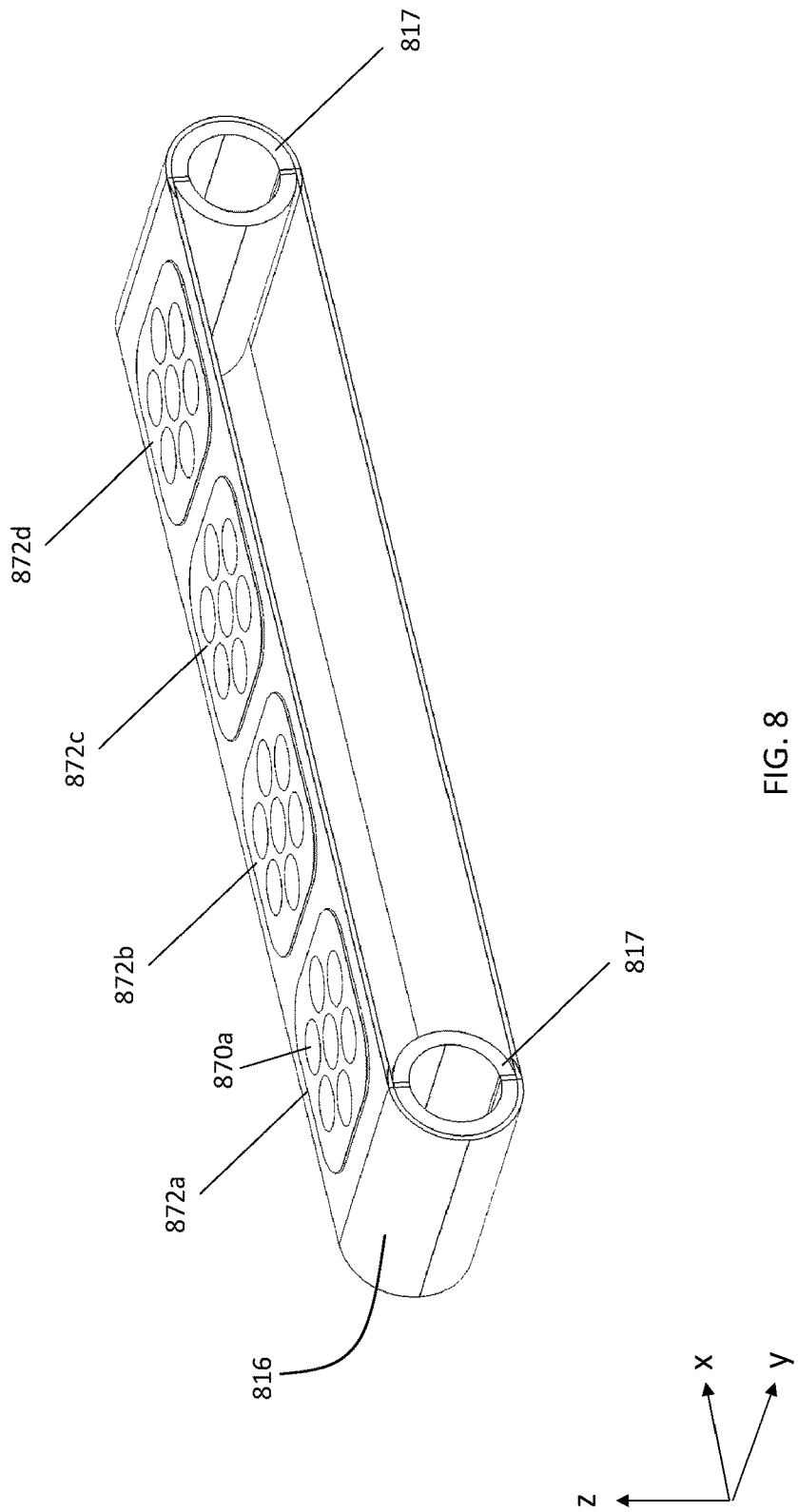
FIG. 8 shows a perspective view of a moveable belt having multiple substrate holders mounted thereon according to an illustrative embodiment.
Figure 9:
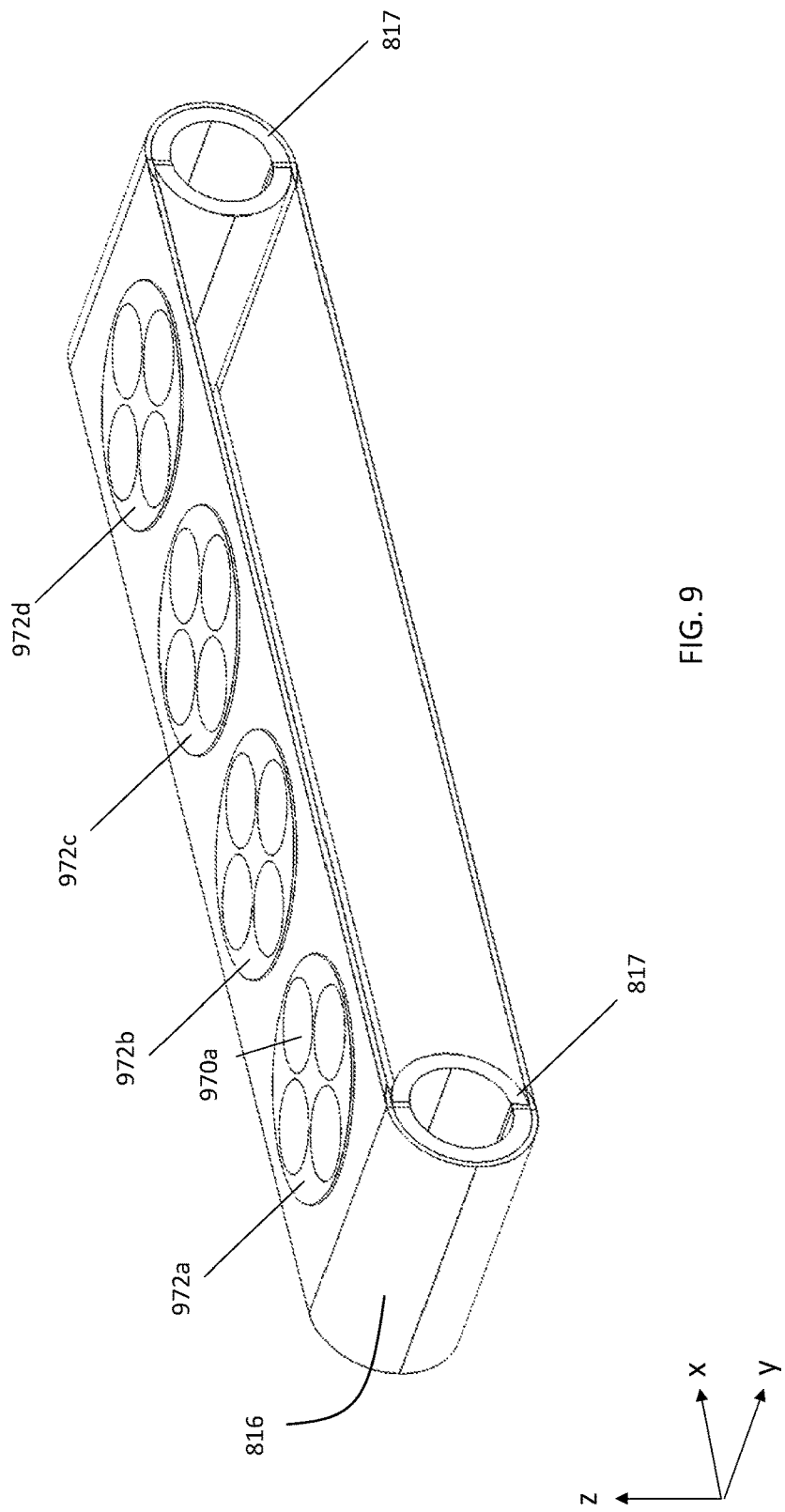
FIG. 9 shows a perspective view of the moveable belt of FIG. 8 having multiple substrate holders mounted thereon according to an illustrative embodiment.

A length $l_s$, height $h_s$, (both labeled) and width $w_s$ (not shown) of a separation zone of the separation chamber 210e have definitions analogous to those described above with respect to the deposition zone of the deposition chamber 208h. However, $l_s$ and $h_s$ may also be selected to optimize interfacial quality of the multilayer heterostructure. Like $h_{fp}$, the selected values may depend upon the operating temperature, the range of flow rates used in adjacent deposition chambers 208g, 208i, and the use of gas flow (and its rate) into the separation chamber 210e. However, in embodiments, as shown in FIG. 3E, $h_s$ may be determined by the selection of $h_{fp}$ such that $h_s=h_{fp}$ (i.e., substantially equal; not necessarily exactly equal but as equal as possible given standard manufacturing techniques). In addition, $l_s$ is generally less than $l_d$. Although in the embodiment of FIG. 3D, $l_s$ is greater than the diameter of the substrate 370 (or the effective diameter of a collection of substrates as shown in FIGS. 8, 9), in other embodiments, $l_s$ may be the same as (i.e., substantially the same) or even less than the diameter of the substrate 370 (or the effective diameter of a collection of substrates). The ratio of $h_s/l_s$ may also be selected to optimize interfacial quality. In embodiments, $h_s/l_s$ is no greater than 10, no greater than 8, no greater than 6, no greater than 4, no greater than 2, or no greater than 1. This includes embodiments in which $h_s/l_s$ is in the range of from 0.1 to 10, from 0.1 to 5, or from 0.1 to 3, or from 0.1 to 1. The width $w_s$ may be selected similarly to the width $w_d$ described above with respect to the deposition zone. The dimensions of other separation chambers/zones in the deposition assembly 202 may be similarly configured.

In the present disclosure, the phrase "optimizing interfacial quality" can refer to achieving a predetermined interfacial transition region value between two material layers of a multilayer heterostructure to be deposited. The "interfacial transition region value" refers to the distance over which the composition transitions from one distinct material composition (i.e., one of the two material layers) to another distinct material composition (i.e., the other of the two material layers). The smaller this distance the sharper the interface. Ideally, the transition from one distinct material composition to another distinct material composition is a step function such that the distance is effectively zero. However, in embodiments, the predetermined interfacial transition region value is no more than 10 nm. This includes embodiments in which the predetermined interfacial transition region value is no more than 8 nm, no more than 6 nm, no more than 5 nm, no more than 4 nm, no more than 3 nm, no more than 2 nm, no more than 1 nm, or no more than 0.5 nm. Selection of the parameters of $h_{fp}$, $h_s$, $l_s$, and/or $h_s/l_s$ to provide any of these predetermined interfacial transition region values means that the values of these parameters are those which provide a deposited multilayer heterostructure exhibiting at least one interfacial transition region having a value within the recited range. More than one or all of the interfacial transition regions within the deposited multilayer heterostructure may have values within the recited range, but this is not necessary for every embodiment.

Whether a particular deposition assembly is configured to provide a deposited multilayer heterostructure exhibiting an interfacial transition region value within a recited range may be determined using the COMSOL Multiphysics program. These calculations provide plots, such as the plots of FIGS. 4A-4D, which are described in detail below. Experimentally, whether a deposited multilayer heterostructure fabricated using a particular deposition assembly exhibits a predetermined interfacial transition region value within a recited range may be determined using transmission electron microscopy (TEM), high resolution x-ray diffraction (HRXRD), and atom probe tomography.

The values of the predetermined interfacial transition regions provided by a particular deposition assembly may be determined with reference to a specific control multilayer heterostructure, e.g., a GaAs/GaInP bilayer. That is, a deposition assembly may be characterized by a selection of $h_{fp}$, $h_s$, $l_s$ and/or $h_s/l_s$ which provides a GaAs/GaInP bilayer exhibiting any of the predetermined interfacial transition region values above. Moreover, the predetermined interfacial transition region values may be determined with reference to a particular component of the GaAs/GaInP bilayer, e.g., with respect to Ga. (See FIG. 4A as further described below.)

FIGS. 4A-4D show plots generated using the COMSOL Multiphysics program for a deposition assembly similar to the portion A of the deposition assembly 202 (see FIGS. 3A-3E). In the calculations, a reactant gas mixture for depositing GaAs was flowed into the deposition chamber 208g at a flow rate of 0.35 m/s and another reactant gas mixture for depositing GaInP was flowed into the deposition chamber 208i at a flow rate of 0.35 m/s. The parameters of the deposition zones defined by deposition chambers 208g, 208i were as follows: $h_d$=1 inch; $l_d$=2 m. The parameters of the fluid pathways 394e, 396e and the separation zone defined by the separation chamber 210e were as follows: $h_{fp}$=$h_s$; $l_s$=0.125 m; and $h_s$ was varied in steps from 0.1 inch to 1 inch. The speed of the moveable belt 216 was 0.02 m/s.

Figure 4A:
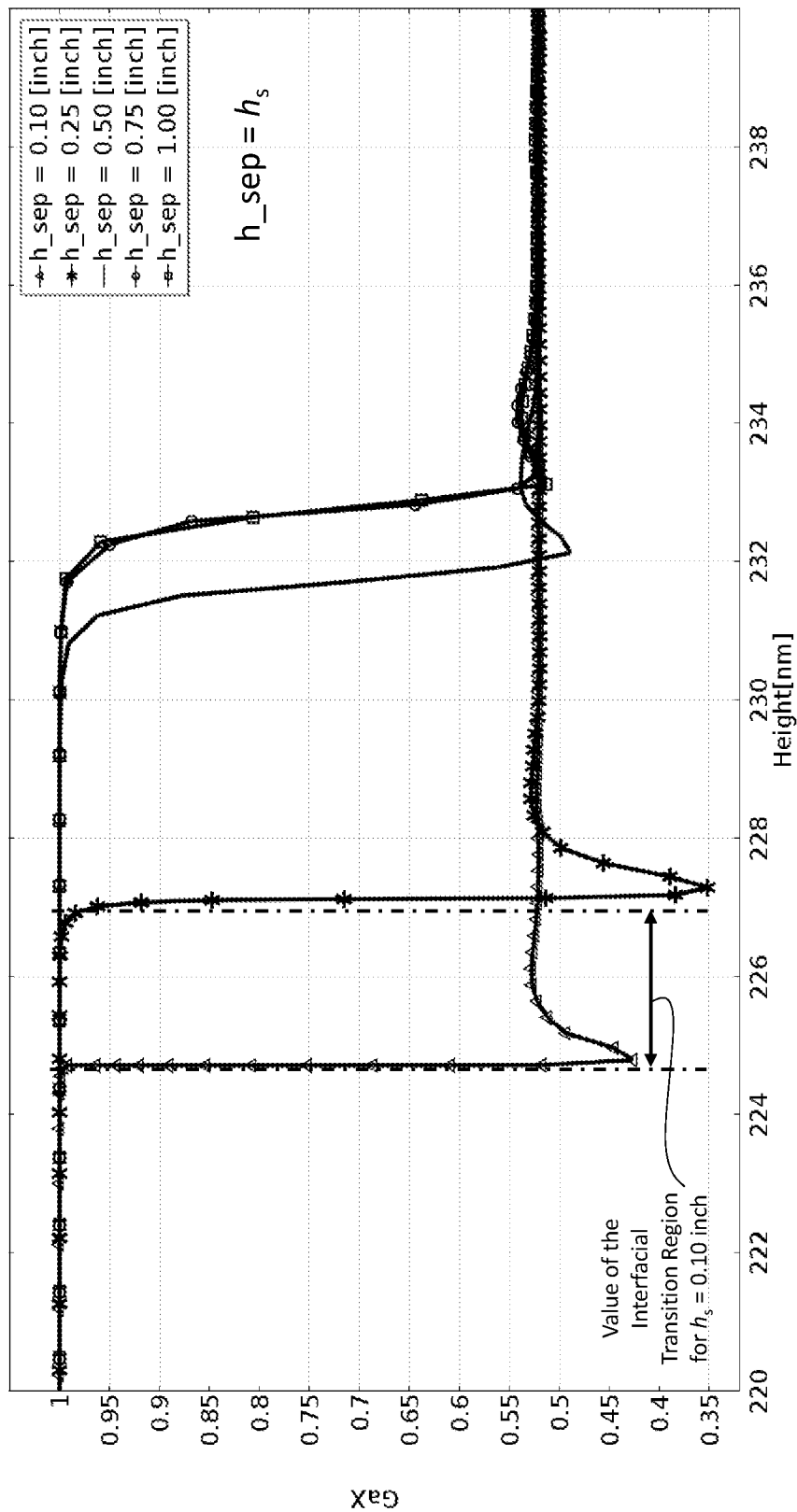
FIGS. 4A-4D show plots of interfacial quality generated using the COMSOL Multiphysics program for a deposition assembly similar to the portion of the deposition assembly of FIGS. 3A-3E.
Figure 4B:
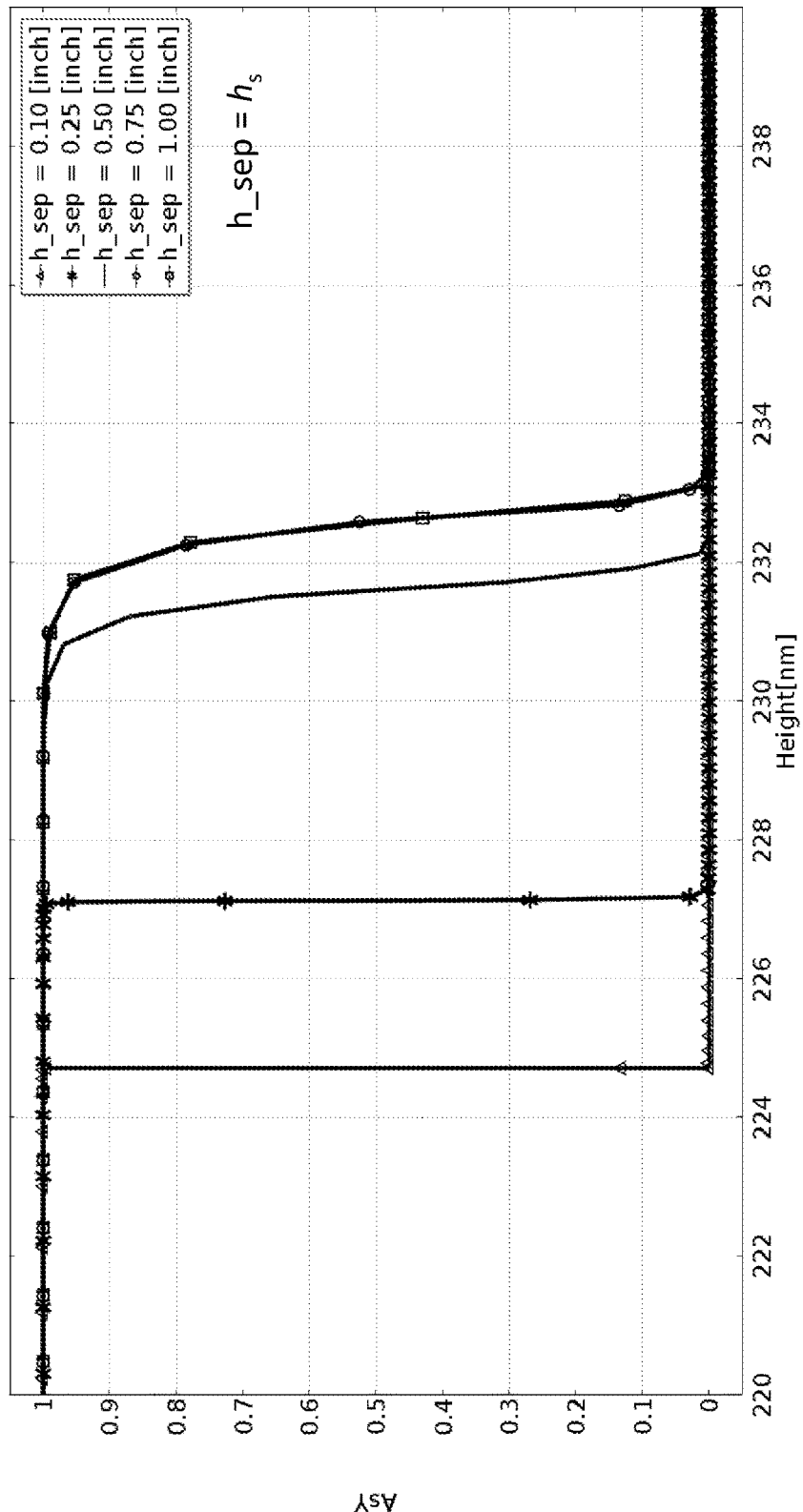
Figure 4C:
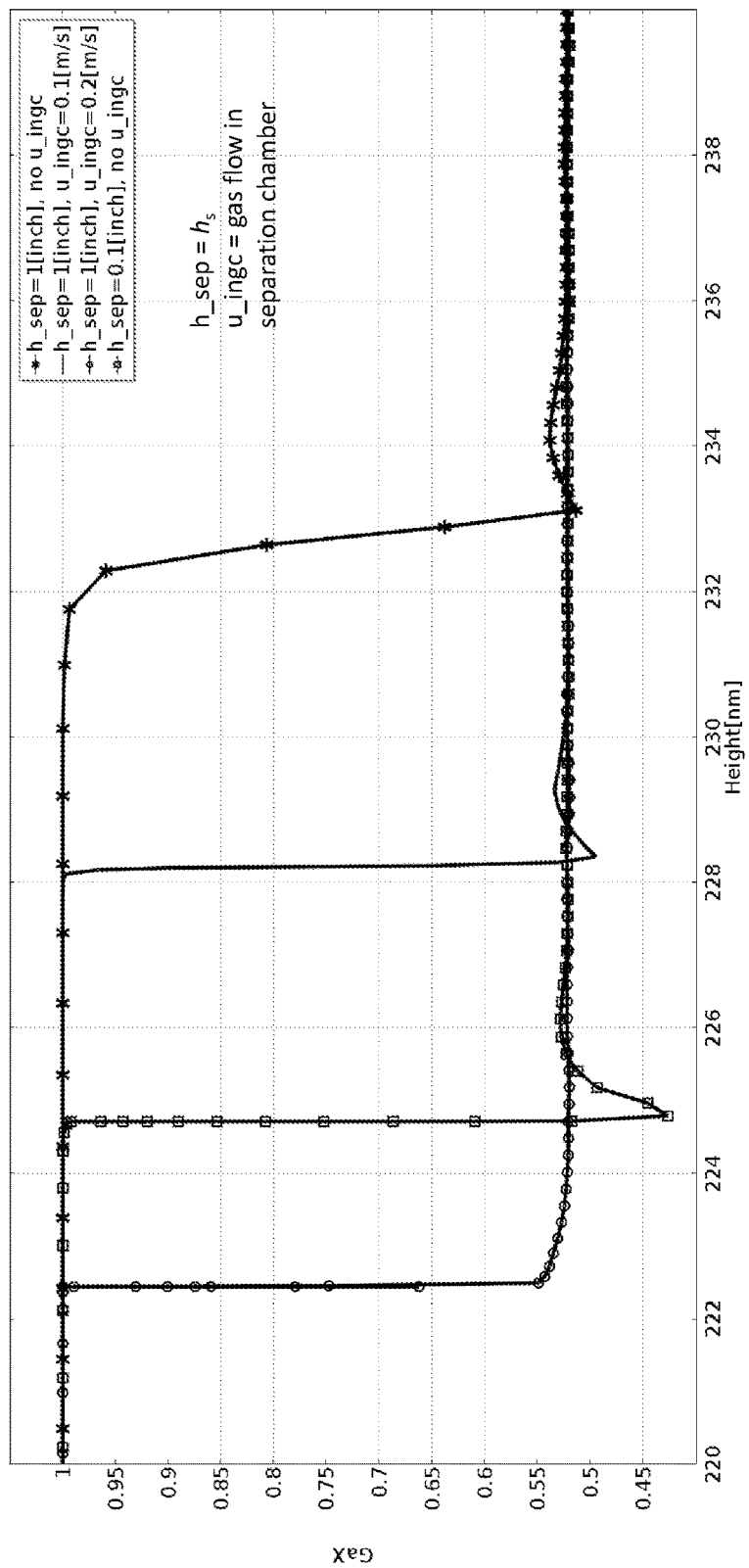
Figure 4D:
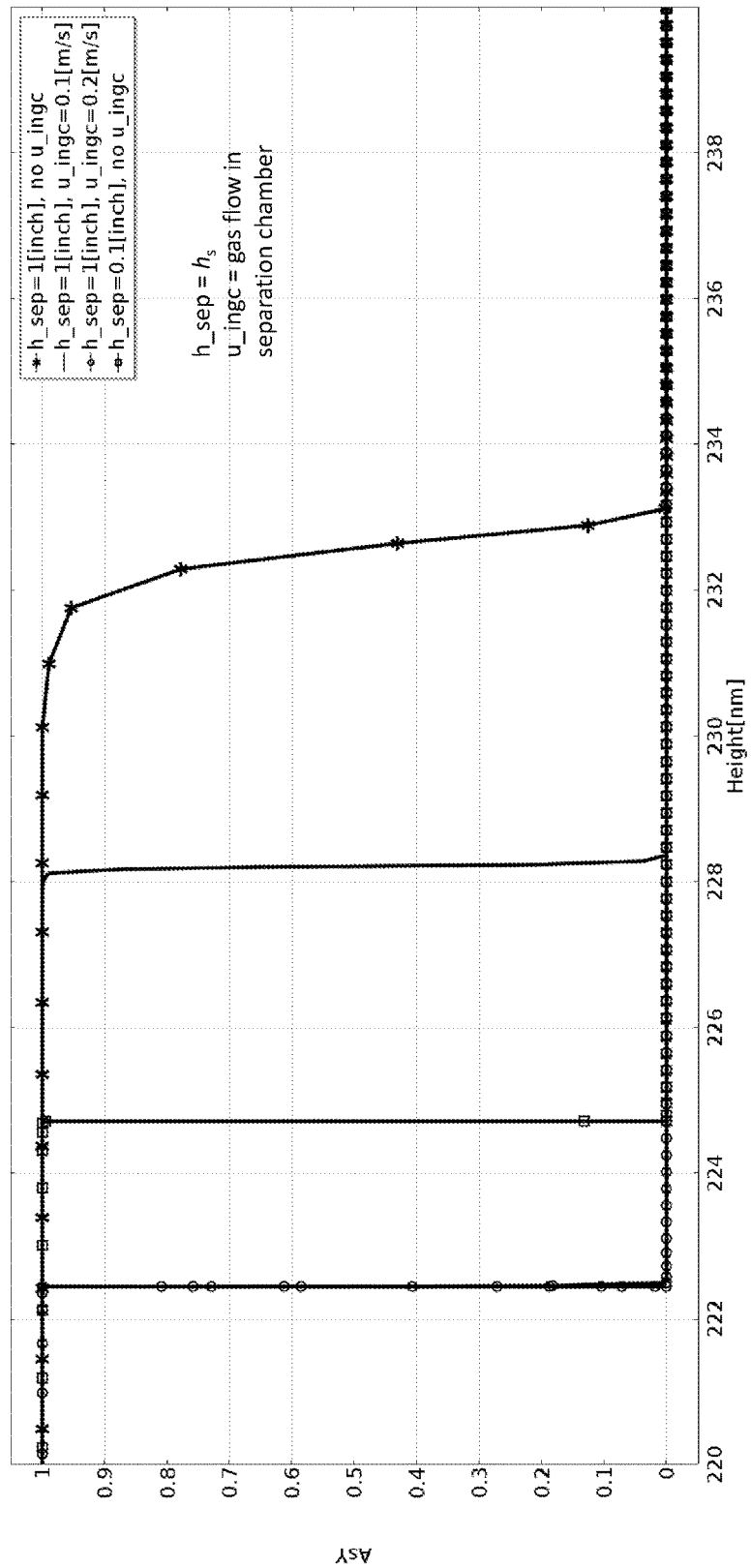

The plots of FIGS. 4A-4D show how the composition (x-axis) of a 20 nm slice (y-axis) of a bilayer heterostructure (GaAs/GaInP) changes across the slice. The 20 nm slice includes the interface formed between the two different material layers. FIGS. 4A and 4B show the results when no gas was flowed into the separation chamber 210e. FIG. 4A shows how the concentration of Ga changes across the slice while FIG. 4B shows how the concentration of As changes across the slice. Thus, together, these plots show how the composition across the slice transitions from GaAs (at 220 nm) to GaInP (at 240 nm). FIGS. 4C and 4C show the analogous results when using inert gas flow into the separation chamber 210e at rates including 0.1 m/s and 0.2 m/s.

The value of the interfacial transition region provided by this particular deposition assembly may be determined from the plot of FIG. 4A. The value is the distance over which the composition transitions from one distinct material composition (here, GaAs) to another distinct material composition (here, GaInP). By way of illustration, the interfacial transition region value for one of the curves shown in FIG. 4A (the curve for $h_s$=0.10 inch) is labeled and may be taken as the distance between the point at which the Ga concentration (i.e., x value) begins to decrease and the point at which the Ga concentration (i.e., x value) stabilizes to the desired final concentration (i.e., maintains a concentration within in ±0.01 of desired concentration). In this case, the deposition assembly is configured (when $h_s$=0.10 inch) to provide an interfacial transition region value of about 2 nm, as determined with reference to component Ga in the bilayer heterostructure GaAs/GaInP, even without flowing any gas into the separation chamber 210e. Thus, for any particular configuration of a deposition assembly, a plot like FIG. 4A may be generated to determine whether the configuration achieves a desired interfacial transition region value or range of values.

Figure 10A:
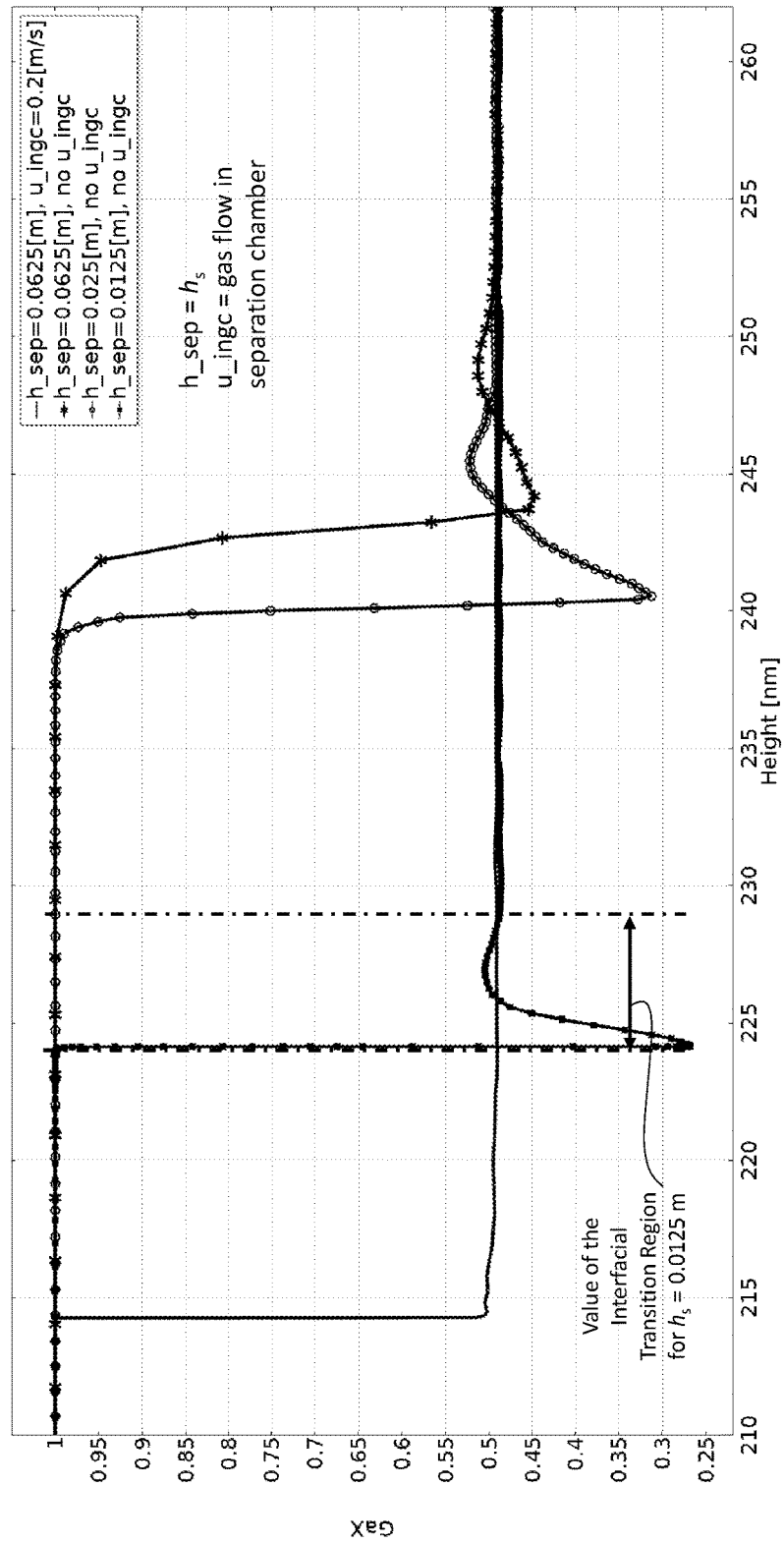
FIGS. 10A-10B show plots of interfacial quality generated using the COMSOL Multiphysics program for a deposition assembly similar to the portion of the deposition assembly of FIGS. 3A-3E.
Figure 10B:
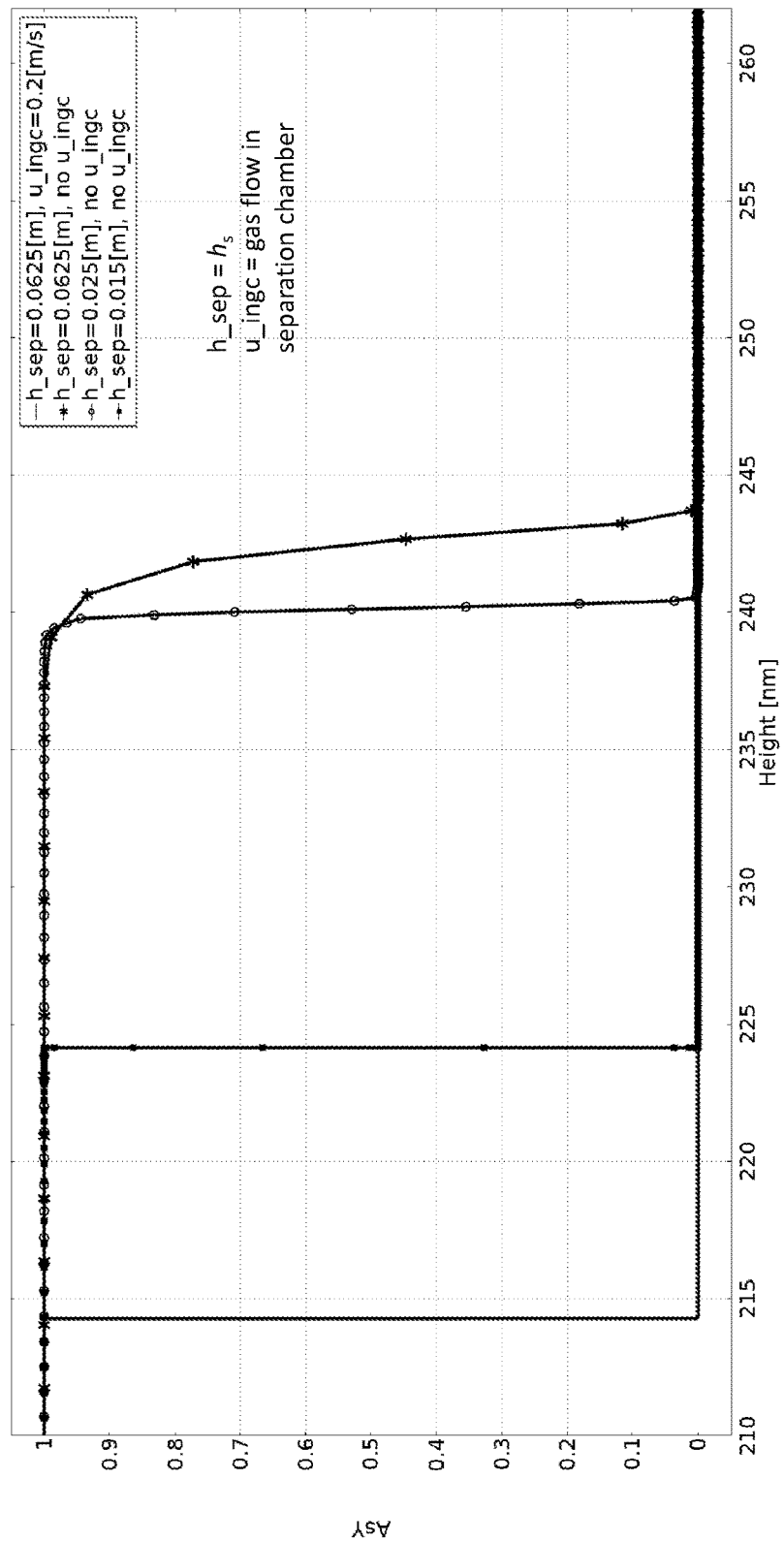

FIGS. 10A-10B show plots generated using the COMSOL Multiphysics program for another deposition assembly similar to the portion A of the deposition assembly 202 (see FIGS. 3A-3E). In the calculations, a reactant gas mixture for depositing GaAs was flowed into the deposition chamber 208g at a flow rate of 0.35 m/s and another reactant gas mixture for depositing GaInP was flowed into the deposition chamber 208i at a flow rate of 0.35 m/s. The parameters of the deposition zones defined by deposition chambers 208g, 208i were as follows: $h_d$=0.125 m; $l_d$=2 m. The parameters of the fluid pathways 394e, 396e and the separation zone defined by the separation chamber 210e were as follows: $h_{fp}$=$h_s$; 4=0.5 m; and $h_s$ was varied in steps from 0.0125 m, 0.025 m, and 0.0625 m. As shown in the plots, in some cases gas was flowed into the separation chamber 210e at 0.2 m/s; in some cases no gas flowed into the separation chamber 210e. The speed of the moveable belt 216 was 0.02 m/s. FIG. 10A shows how the concentration of Ga changes across the 20 nm slice comprising the GaAs/GaInP interface while FIG. 10B shows how the concentration of As changes across the slice. In this case, the deposition assembly is configured (when $h_s$=0.0125 m) to provide an interfacial transition region value of about 5 nm, as determined with reference to component Ga in the bilayer heterostructure GaAs/GaInP, even without flowing any gas into the separation chamber 210e.

Notably, FIGS. 4A-4D and FIGS. 10A-10B demonstrate that even without flowing any gas into the separation chamber 210e, it is possible to configure the physical geometry of the fluid pathways 394e, 396e and separation zone to achieve extremely sharp interfaces. This was not predictable before the present invention and is contrary to the conventional approach of using gas curtains only.

Figure 5A:
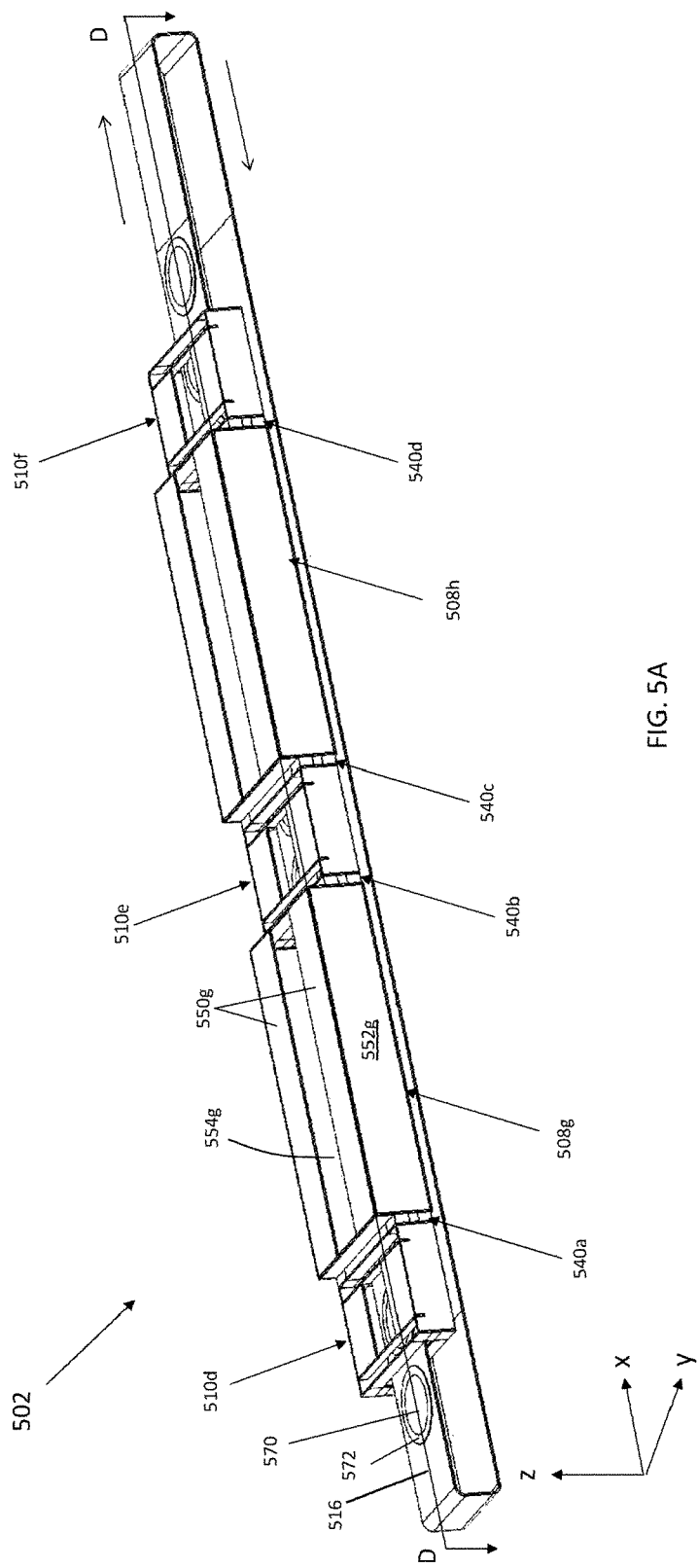
FIG. 5A shows a perspective view of a portion of a deposition assembly according to an illustrative embodiment.
Figure 5B:
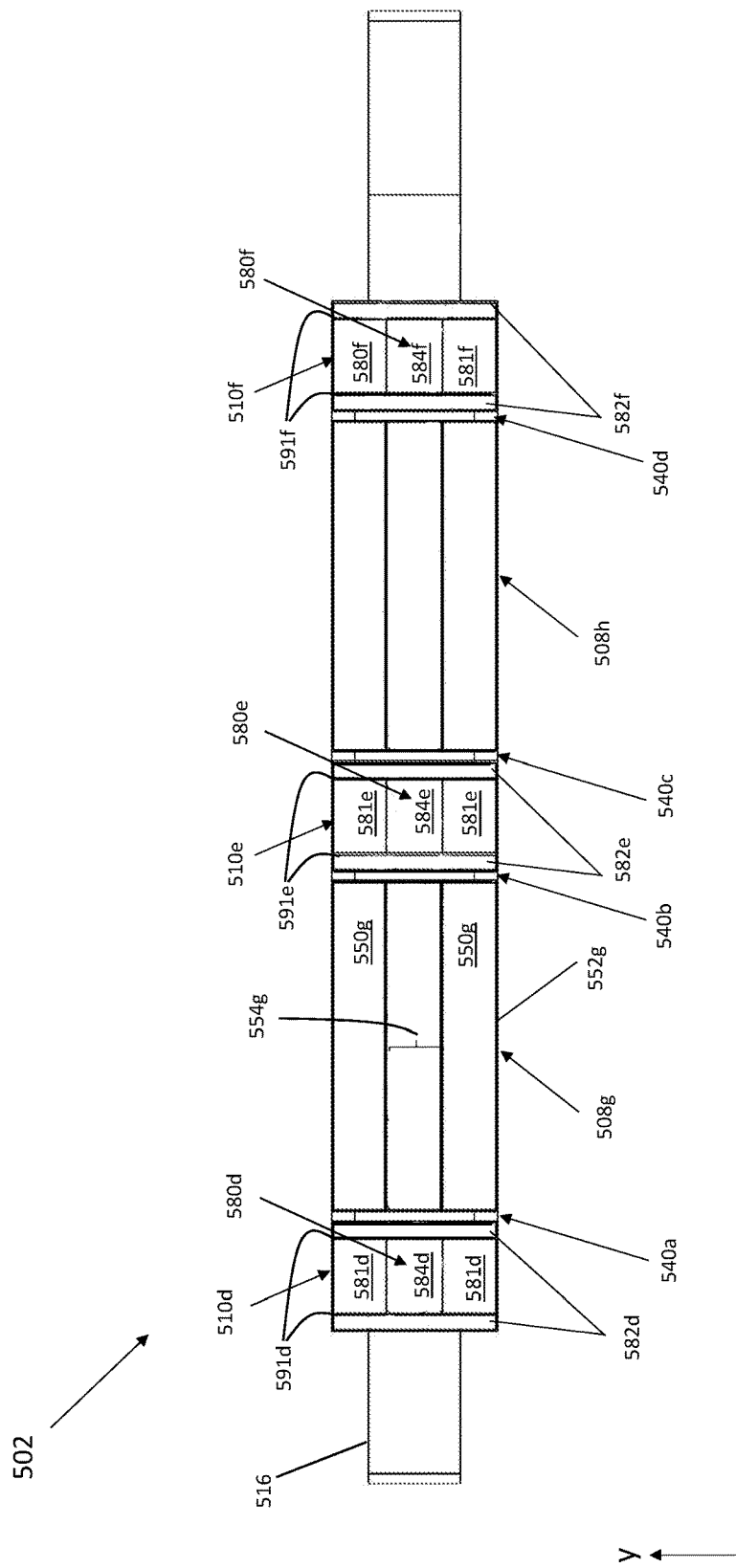
FIG. 5B shows a top view of the portion of the deposition assembly of FIG. 5A.
Figure 5D:
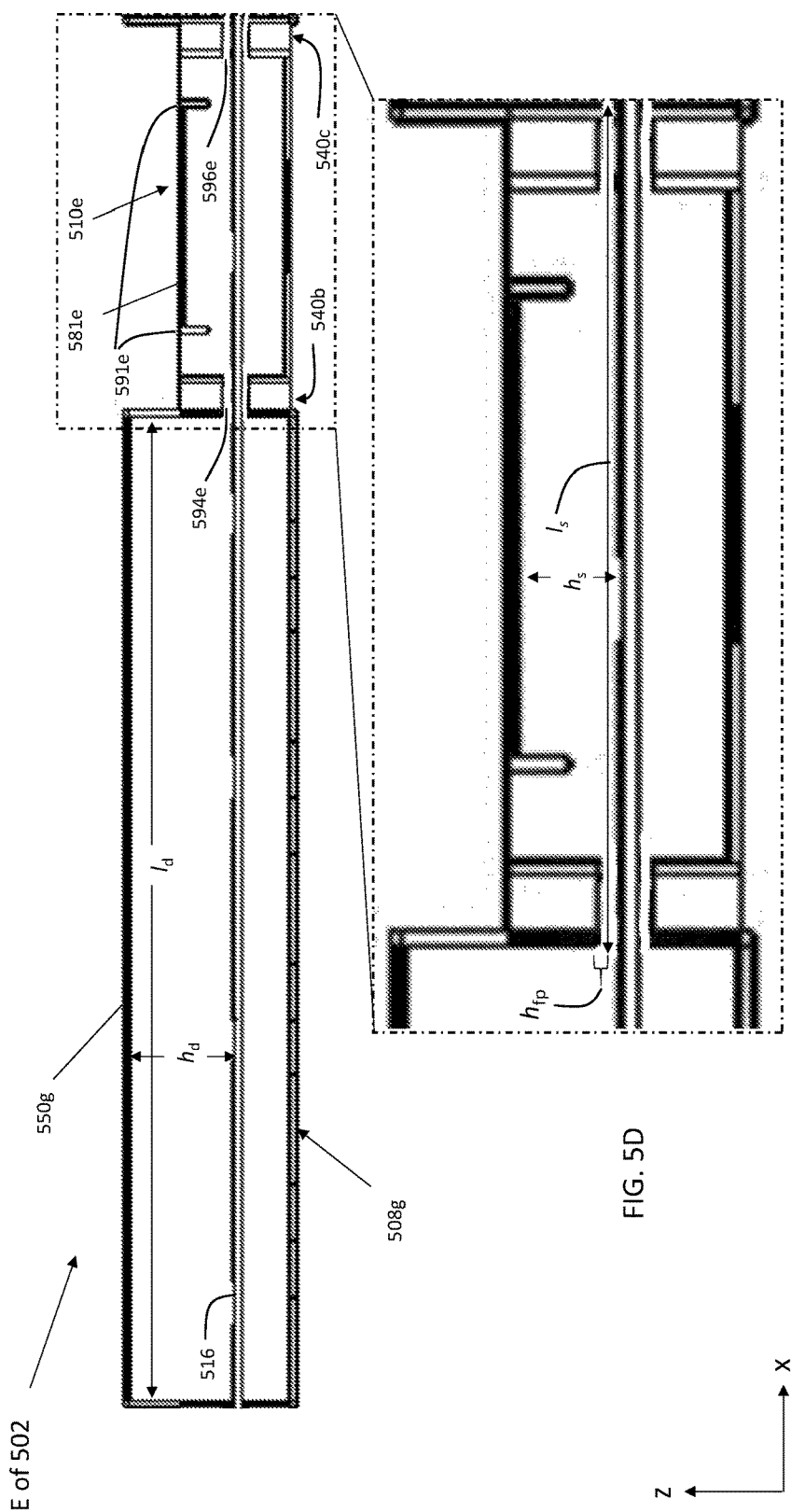
FIG. 5D shows a portion of the cross-sectional view of the portion of FIG. 5C.

FIGS. 5A-5C show another embodiment of a portion 502 of a deposition assembly (e.g., the portion 502 may be considered to be another embodiment of portion A shown in FIG. 3A). FIG. 5A shows a perspective view. FIG. 5B shows a top view (with a moveable belt 516, a substrate 570, and a substrate holder 572 removed for clarity). FIG. 5C shows a cross-sectional view along section D of FIG. 5A. FIG. 5D shows a portion E of FIG. 5C.

The portion 502 comprises deposition chambers 508g, 508h and separation chambers 510d-f. The moveable belt 516 extends longitudinally through the chambers 508g, 508h, and 510d-f to convey the substrate 570 mounted to the substrate holder 572 along a deposition pathway. In this embodiment, the moveable belt 516 is configured as a continuous loop resulting in upper and lower halves. The movement of the moveable belt 516 forward (in a deposition direction) and backward (in a return, post-deposition direction) is indicated with arrows.

In this embodiment, the deposition assembly includes multiple connectors 540a-d. Connector 540a is mounted between the separation chamber 510d and the deposition chamber 508g; connector 540b is mounted between the deposition chamber 508g and the separation chamber 510e; etc. Connectors such as connectors 540a-e may be used as an alternative to sealing chambers directly to other another.

The deposition chambers 508g, 508h are configured similarly to those of FIG. 3A. By way of illustration, the deposition chamber 508g has a top wall 550g, side walls and a bottom wall. A rectangular-shaped deposition inlet port 554g is formed in the top wall 550g. Like FIG. 3A, the separation chambers 510d-f have H-shaped separation inlet ports 580d-f (having parallel bar apertures 582d-f and crossbar apertures 584d-f) formed in top walls 581d-f. However, in this embodiment, the top walls 581d-f further comprise a pair of downwardly extending vertical projections 591d-f positioned along an edge of each parallel bar aperture of parallel bar apertures 582d-f. The vertical projections 591d-f help to establish the parallel bar apertures 582d-f and the crossbar apertures 580d-f as distinct partitions in the separation zones in the interiors of the separation chambers 510d-f so that different rates of gas flow may be established in each partition. By way of illustration, gas may be delivered to the left parallel bar aperture of the pair 582d at a first flow rate, delivered to crossbar aperture 584d at a second flow rate, and delivered to the right parallel bar aperture of the pair 582d at a third flow rate. This is useful to optimize interfacial quality. In other embodiments, instead of using a H-shaped separation inlet port, separation chambers may comprise multiple separation inlet ports, e.g., 3.

The dimensions of the deposition and separation zones defined within the interiors of the deposition and separation chambers of the portion 502 as well as the dimensions of the fluid pathway connecting adjacent deposition and separation chambers are best viewed in FIGS. 5C-5D (the lower half of the moveable belt 516 is removed for clarity). A length $l_d$, height $h_d$, (labeled) and width $w_d$ (not shown) of a deposition zone of the deposition chamber 508g have definitions analogous to those described above with respect to the deposition zone of the deposition chamber 208g.

A first fluid pathway 594e connects the interior of the deposition chamber 208g (left) to the interior of the separation chamber 510e. A second fluid pathway 596e connects the interior of the separation chamber 510e to the interior of the deposition chamber 508h (right, FIG. 5C). In this embodiment, the first and second fluid pathways 594e, 596e are rectangular-shaped channels formed in the connectors 540b, 540c, respectively. The first fluid pathway 594e extends laterally from an inner side wall of the connector 540b to an opposing inner side wall. As shown in the zoomed in portion, a height of the first fluid pathway 594e is labeled $h_{fp}$. The second fluid pathway 596e may be similarly configured. Selection of the heights $h_{fp}$ of the fluid pathways 594e, 596e follows that described above with respect to FIG. 3E. It is noted that for embodiments in which the fluid pathway is configured as a channel but in which the height of the channel varies through the channel (versus the constant height in this embodiment), $h_{fp}$ may be taken as the lowest height in the channel.

A length $l_s$, height $h_s$, (both labeled) and width $w_s$ (not shown) of a separation zone of the separation chamber 210e are also labeled. In this embodiment, $l_s$ extends from the beginning of the fluid pathway 594e in the connector 540b to the end of the fluid pathway 596e in the connector 540c. As described above with respect to the separation zone of the separation chamber 210e (FIG. 3E), $l_s$, $h_s$, and $h_s/l_s$ may be selected to optimize interfacial quality of the multilayer heterostructure. However, in this embodiment, $h_s$ is greater than $h_{fp}$. In other embodiments, $h_s$ may be determined by the selection of $h_{fp}$ such that $h_s=h_{fp}$. The width $w_s$ may be defined and selected as described above with respect to the separation zone of the separation chamber 210e (FIG. 3E).

A deposition assembly having the portion 502 may further comprise an additional chamber(s) to encompass the lower half of the moveable belt 516. Such additional chamber(s) need not be in fluid communication with the deposition/separation chambers encompassing the upper half of the moveable belt 516. Such additional chamber(s) may be operably coupled to a cleaning assembly as illustrated in FIG. 1.

Figure 6A:
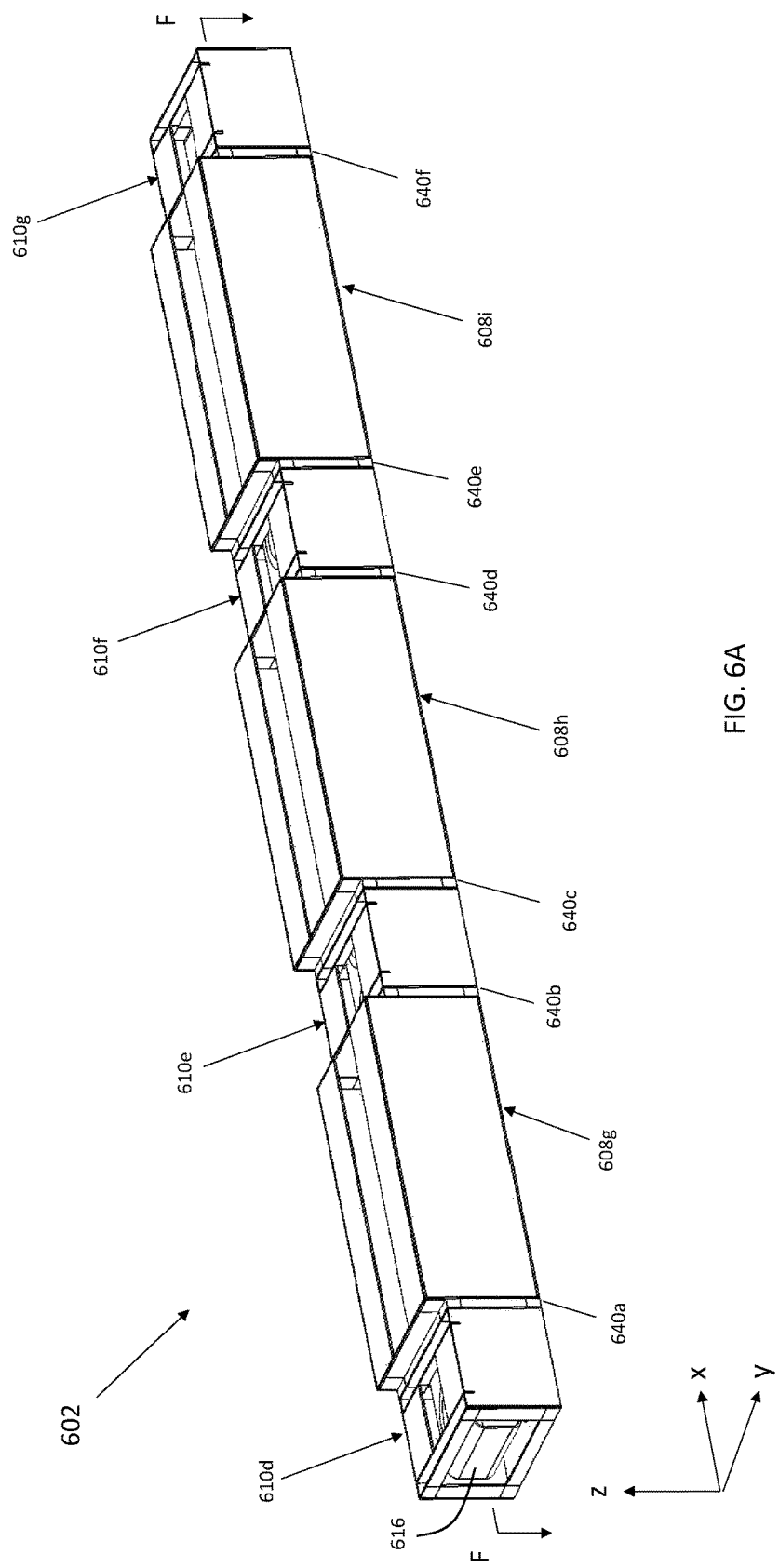
FIG. 6A shows a perspective view of a portion of a deposition assembly according to an illustrative embodiment.
Figure 6B:
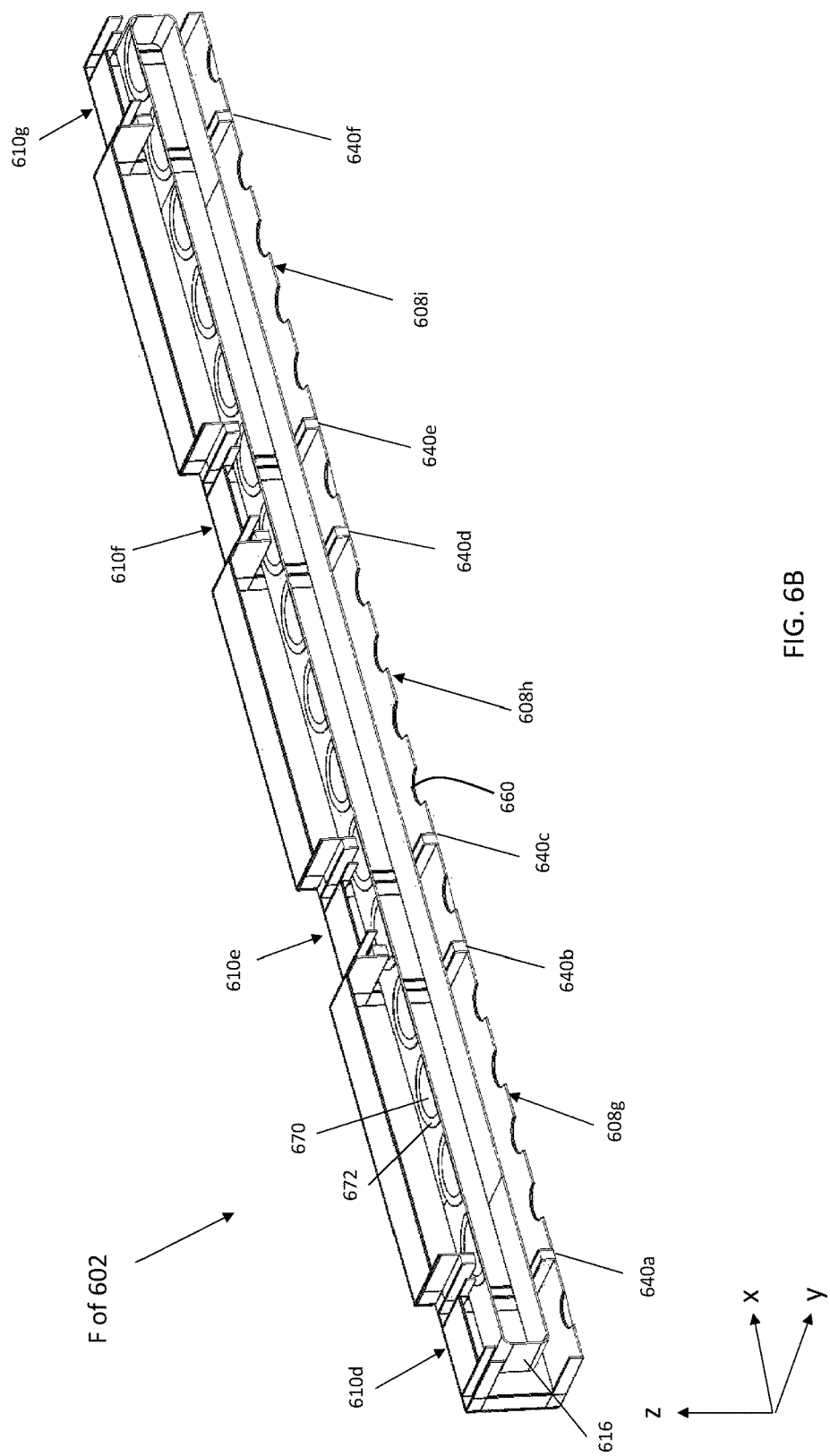
FIG. 6B shows a perspective, cross-sectional view of the portion of the deposition assembly of FIG. 6A.

FIGS. 6A and 6B show another embodiment of a portion 602 of a deposition assembly (e.g., the portion 602 may be considered to be another embodiment of a portion of deposition assembly 202). FIG. 6A shows a perspective view. FIG. 6B shows a perspective, cross-sectional view along section F of FIG. 6A. The portion 602 comprises deposition chambers 608g-i and separation chambers 610d-g. Separation chambers 610d-g are mounted to corresponding deposition chambers of deposition chambers 608g-i via connectors 640a-f. A moveable belt 616 extends longitudinally through the chambers 608g-i and 610d-g to convey a substrate 670 mounted to a substrate holder 672 along a deposition pathway. The chambers 608g-i and 610d-g, the connectors 640a-f, and the moveable belt 616 are configured as shown in FIGS. 5A-5D except that side walls of the chambers 608g-i, 610d-g, and connectors 640a-f extend downwardly to encompass both halves of the moveable belt 616. FIG. 6B also shows illustrative exhaust ports (one is labeled 660).

Figure 7A:
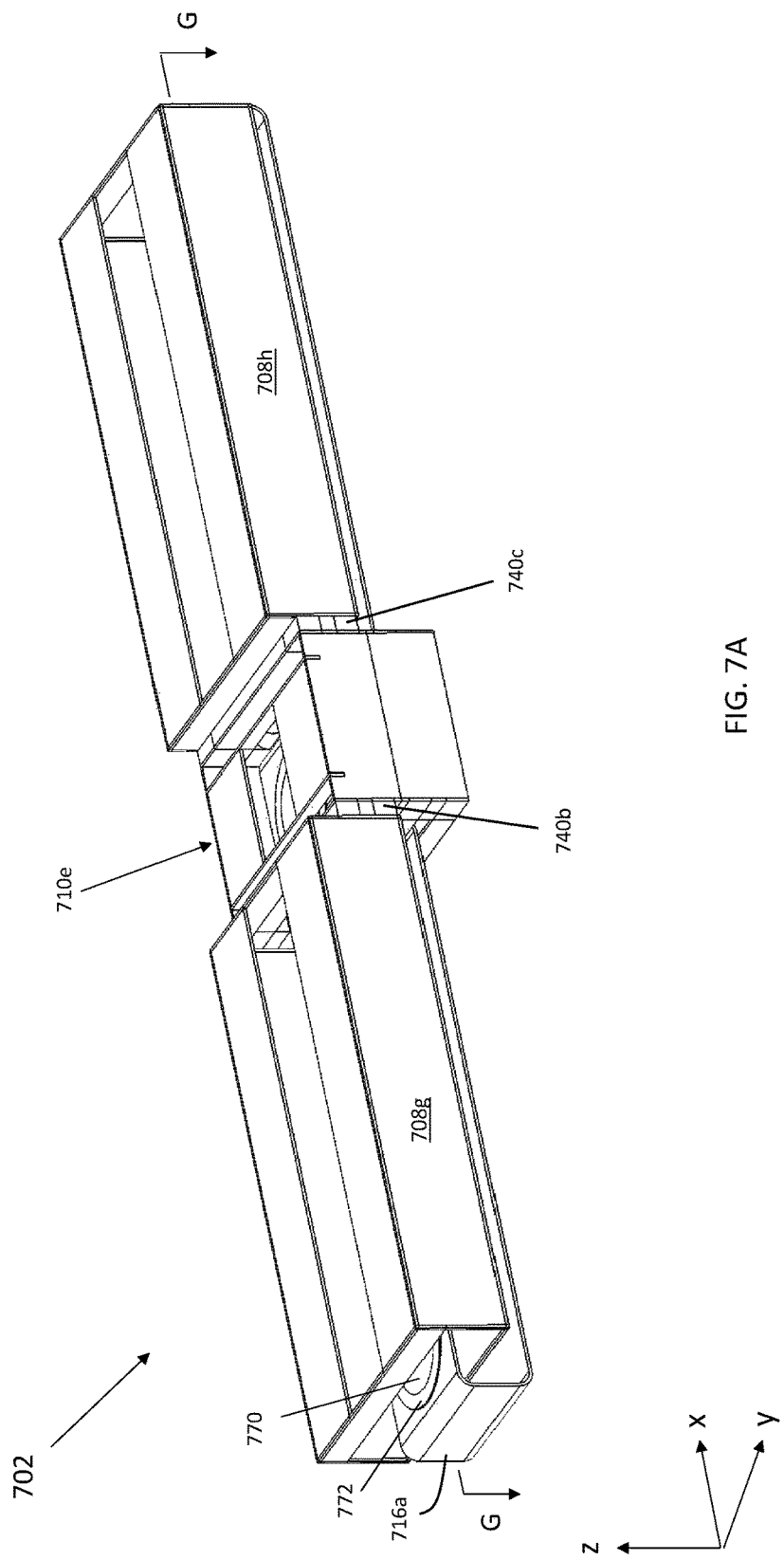
FIG. 7A shows a perspective view of a portion of a deposition assembly according to an illustrative embodiment.
Figure 7B:
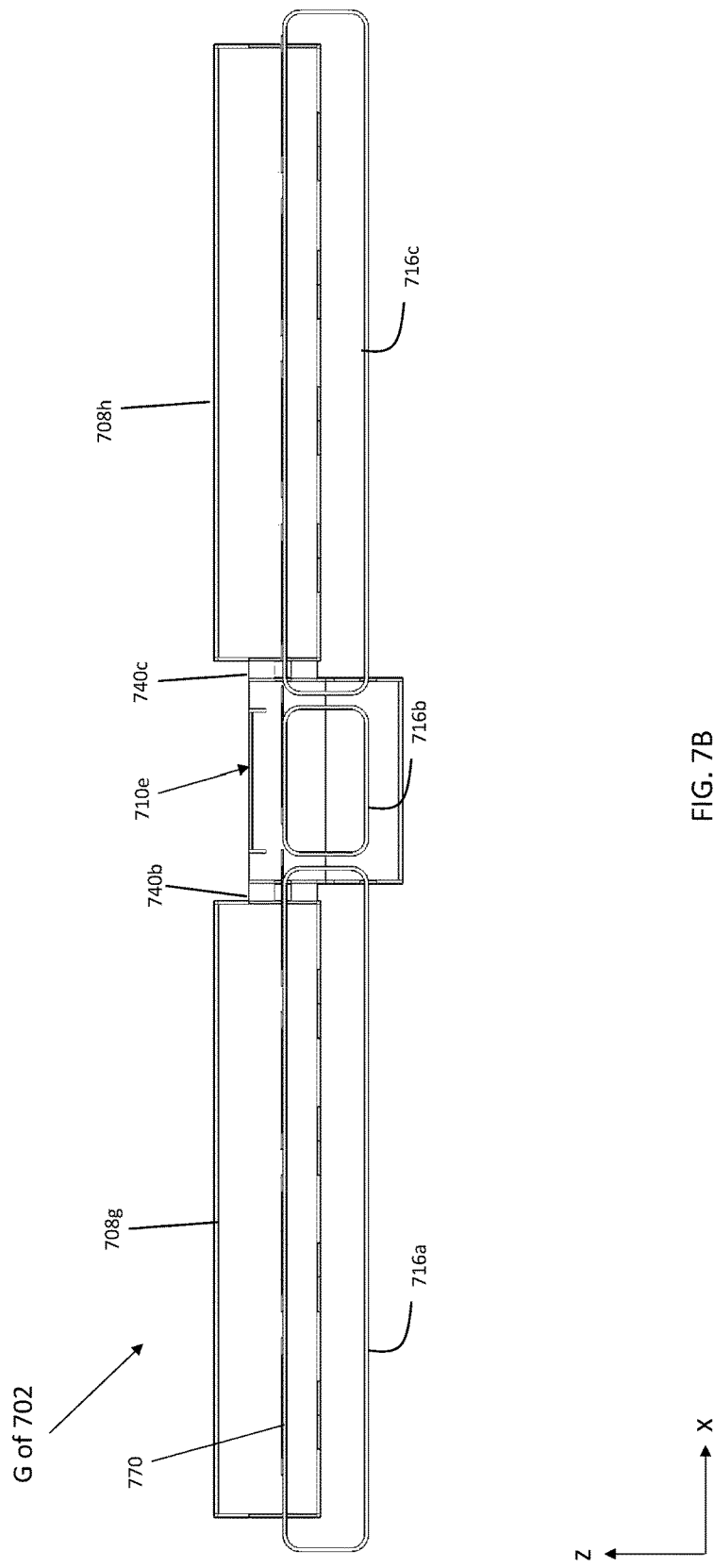
FIG. 7B shows a cross-sectional view of the portion of the deposition assembly of FIG. 7A.

FIGS. 7A and 7B show another embodiment of a portion 702 of a deposition assembly (e.g., the portion 702 may be considered to be another embodiment of a portion of deposition assembly 202). FIG. 7A shows a perspective view. FIG. 7B shows a cross-sectional view along section G of FIG. 7A. The portion 702 comprises deposition chambers 708g, 708h and separation chamber 710e. The separation chamber 710e is mounted to deposition chambers 708g, 708h via connectors 740b, 740c. In this embodiment, the deposition assembly comprises multiple moveable belts 716a-c. Each deposition chamber 708g, 708h and separation chamber 710e has contained therein (either partially or fully) an associated moveable belt of the moveable belts 716a-c. Together, the moveable belts 716a-c extend longitudinally through the chambers 708g, 708h, 710e to convey a substrate 770 mounted to a substrate holder 772 along a deposition pathway. The deposition chambers 708g, 708h, the separation chamber 710e, and the connectors 740b, 740c are configured as shown in the portion 502 of FIGS. 5A-5D except that side walls of the separation chamber 710e extend downwardly to encompass both halves of the moveable belt 716b and ends of both halves of the moveable belts 716a, 716c.

FIGS. 2, 3A-3E, 5A-5D, 6A-6B and 7A-7B show various embodiments of a deposition assembly (or portions thereof) having various illustrative features. However, it is to be understood that the present disclosure also encompasses deposition assemblies having different combinations of the various illustrative features.

FIGS. 8 and 9 shows perspective views of different illustrative configurations of a moveable belt, substrate holders and substrate packing arrangements. These illustrative embodiments are useful for increasing the throughput of the present HVPE systems. FIG. 8 shows a moveable belt 816 mounted on rollers 817. The moveable belt 816 has dimensions selected to accommodate four square-shaped substrate holders 872a-d. Each substrate holder 872a-d has dimensions selected to accommodate seven substrates (one is labeled 870a). In FIG. 9, circular shaped substrate holders 972a-d are mounted on the moveable belt 816 for accommodating slightly larger substrates (one is labeled 970a).

The components of the present HVPE systems may be formed from a variety of materials having the mechanical and chemical properties necessary to achieve their functionality. By way of illustration, quartz or steel may be used for the chambers of the deposition assembly. Ceramic or graphitic or amorphous materials may be used for the moveable belt(s). The moveable belt(s) may be solid (impermeable to fluids) or made quasi permeable (e.g., to gases flowing through the chambers of the deposition assembly) through perforations or holes in the belt.

The present HVPE systems may be used to form a variety of multilayer heterostructures. In embodiments, the material layers of the multilayer heterostructures are selected from group III-V semiconductors. By way of illustration, a HVPE system comprising the deposition assembly 202 of FIG. 2 may be used to form the multilayer heterostructure of Table 1 on a substrate of GaAs (350 μm thick, n doped to $3 \times 10^{18}$ $cm^{-3}$). In particular, the buffer layer may first be deposited on the substrate in the deposition chamber 208a; next, the back surface field (BSF) layer may be deposited in the deposition chamber 208b; next, the thick base layer may be deposited in the deposition chambers 208c-f; next, the emitter layer may be deposited in the deposition chamber 208g; next, the window layer may be deposited in the deposition chamber 208h; and finally, the cap layer may be deposited in the deposition chamber 208i.

TABLE 1

Multilayer heterostructure.

| Function of Layer | Composition | Thickness | Doping |
| --- | --- | --- | --- |
| Cap | GaAs | 500 nm | p = $3 \times 10^{18}$ $cm^{-3}$ |
| Window | GaInP | 30 nm | p = $3 \times 10^{18}$ $cm^{-3}$ |
| Emitter | GaAs | 500 nm | p = $5 \times 10^{18}$ $cm^{-3}$ |
| Base | GaAs | 3 μm | n = $2 \times 10^{17}$ $cm^{-3}$ |
| Back Surface Field region | GaInP | 250 nm | n = $3.5 \times 10^{18}$ $cm^{-3}$ |
| Buffer | GaAs | 200 nm | n = $1 \times 10^{18}$ $cm^{-3}$ |

The multilayer heterostructure of Table 1 may be used in a photovoltaic device. Such a device may include a front contact on the cap layer, an antireflective coating on the exposed portions of the window layer, and a back contact layer on the substrate. Additional devices of similar structure would be photodiode detectors utilizing InGaAs, thick to ultrathick metamorphic buffers layers from GaAsP, InGaAs, InGaP, as well as other systems containing, for example Ga, In, As, P, Sb, etc, for use as alternative substrates for epitaxy requiring a lattice parameter not afforded by the binary semiconductors.

Although the present systems have been described with respect to the HVPE deposition process, they may be used with other deposition techniques, e.g., metalorganic vapor phase epitaxy, molecular beam epitaxy. They may also be used for other processes such as wafer processing and solar device processing.

Unless otherwise specified, the term "mount" includes join, unite, connect, couple, associate, insert, hang, hold, affix, attach, fasten, bind, paste, secure, bolt, screw, rivet, solder, weld, glue, form over, layer, mold, rest on, rest against, abut, and other like terms. The phrases "mounted on", "mounted to", and equivalent phrases indicate any interior or exterior portion of the element referenced. Elements referenced as mounted to each other herein may further be integrally formed together, for example, using a molding or thermoforming process. As a result, elements described herein as being mounted to each other need not be discrete structural elements. The elements may be mounted permanently, removably, or releasably unless specified otherwise.

Use of directional terms, such as top, bottom, right, left, front, back, etc. are merely intended to facilitate reference to various surfaces that form components of the devices referenced herein and are not intended to be limiting in any manner.

The word "illustrative" is used herein to mean serving as an example, instance, or illustration. Any aspect or design described herein as "illustrative" is not necessarily to be construed as preferred or advantageous over other aspects or designs. Further, for the purposes of this disclosure and unless otherwise specified, "a" or "an" means "one or more."

The foregoing description of illustrative embodiments of the invention has been presented for purposes of illustration and of description. It is not intended to be exhaustive or to limit the invention to the precise form disclosed, and modifications and variations are possible in light of the above teachings or may be acquired from practice of the invention. The embodiments were chosen and described in order to explain the principles of the invention and as practical applications of the invention to enable one skilled in the art to utilize the invention in various embodiments and with various modifications as suited to the particular use contemplated. It is intended that the scope of the invention be defined by the claims appended hereto and their equivalents.

What is claimed is:

1. A system for fabricating multilayer heterostructures via hydride vapor phase epitaxy (HVPE), the system comprising:

a deposition assembly comprising:

a plurality of deposition chambers and a plurality of separation chambers mounted together, each separation chamber having two opposing ends, each end mounted to a deposition chamber of the plurality of deposition chambers and in fluid communication with the deposition chamber via a fluid pathway, wherein each deposition chamber of the plurality of deposition chambers defines a deposition zone having a height $h_d$, each separation chamber defines a separation zone having a height $h_s$ and a length $l_s$, and each fluid pathway has a height $h_{fp}$, wherein $h_{fp}$, $h_s$ and $l_s$ are selected to provide a predetermined interfacial transition region value between different material layers of a multilayer heterostructure; and a moveable belt configured to continuously convey a substrate mounted thereon through the plurality of deposition chambers and the plurality of separation chambers; and a gas delivery assembly configured to deliver reactant gas mixtures to the deposition assembly for deposition on the substrate via HVPE.

2. The system of claim 1, wherein the predetermined interfacial transition region value is less than 5 nm.

3. The system of claim 1, wherein $h_{fp}$ is a value which provides a headspace above the substrate conveyed through each fluid pathway of no more than 2 cm.

4. The system of claim 1, wherein $h_s/l_s$ is less than 1.

5. The system of claim 1, wherein $h_s=h_{fp}$.

6. The system of claim 5, wherein $h_{fp}$ is a value which provides a headspace above the substrate conveyed through each fluid pathway of no more than 2 cm.

7. The system of claim 6, wherein $h_s/l_s$ is less than 1.

8. The system of claim 1, wherein $h_{fp}$ and $h_s$ are both less than $h_d$.

9. The system of claim 1, wherein each separation chamber of the plurality of separation chambers comprises a separation inlet port through which gases from the gas delivery system may flow, the separation inlet port having a shape and dimensions also selected to provide the predetermined interfacial transition region.

10. The system of claim 9, wherein the shape is an H-shape having two parallel bar apertures connected to a crossbar aperture.

11. The system of claim 10, wherein the gas delivery system is configured to deliver a gas at a first flow rate to one of the two parallel bar apertures, gas at a second flow rate to another of the two parallel bar apertures, and gas at a third flow rate to the crossbar aperture.

12. The system of claim 1, wherein the gas delivery system is configured to deliver a gas composition to one or more of the separation chambers of the plurality of separation chambers, the gas composition selected to suppress loss of volatile components from a deposited material layer.

13. The system of claim 1, further comprising a control assembly configured to control the moveable belt and to control the delivery of the reactant gas mixtures.

14. The system of claim 13, wherein the control assembly is further configured to maintain the plurality of deposition chambers and the plurality of separation temperatures at a single, predetermined temperature.

15. A method of fabricating multilayer heterostructures via HVPE using the system of claim 1, the method comprising:

delivering a first reactant gas mixture to a first deposition chamber of the plurality of deposition chambers while conveying the substrate through the first deposition chamber to deposit a first material layer on the substrate via HVPE;

conveying the substrate through a first separation chamber of the plurality of separation chambers;

delivering a second reactant gas mixture to a second deposition chamber of the plurality of deposition chambers while conveying the substrate through the second deposition chamber to deposit a second material layer on the first material layer via HVPE;

conveying the substrate through a second separation chamber of the plurality of separation chambers; and optionally, delivering one or more additional reactant gas mixtures to one or more additional deposition chambers of the plurality of deposition chambers while conveying the substrate through the one or more additional deposition chambers to deposit one or more additional material layers via HVPE.

16. The method of claim 15, wherein gas is not delivered to one or both of the first and second separation chambers while conveying the substrate.

17. The method of claim 15, wherein a gas composition is delivered to one or both of the first and second separation chambers while conveying the substrate, the gas composition selected to suppress loss of volatile components from a deposited material layer.

18. The method of claim 15, wherein the plurality of deposition chambers and the plurality of separation temperatures are maintained at a single, predetermined temperature.

19. The method of claim 15, wherein the multilayer heterostructure comprises material layers selected from group semiconductors.

20. The method of claim 19, wherein the multilayer heterostructure comprises a buffer layer of GaAs, a back surface field layer of GaInP on the buffer layer, a base layer of GaAs on the BSF layer, an emitter layer of GaAs on the base layer, a window layer of GaInP on the emitter layer, and a cap layer of GaAs on the window layer.

* * * * *

UNITED STATES PATENT AND TRADEMARK OFFICE
CERTIFICATE OF CORRECTION

PATENT NO. : 10,190,234 B1
APPLICATION NO. : 15/797683
DATED : January 29, 2019
INVENTOR(S) : Thomas Francis Kuech et al.

Page 1 of 1

It is certified that error appears in the above-identified patent and that said Letters Patent is hereby corrected as shown below:

In the Specification

Column 12, Line 37:
Delete the phrase "4=0.5 m;" and replace with --$l_s$ = 0.5 m;--.

Column 16, Lines 2-3:
Delete the phrase "binary semiconductors." and replace with --binary III-V semiconductors.--.

In the Claims

Claim 19, Column 18, Line 39:
Delete the phrase "group semiconductors." and replace with --group III-V semiconductors.--.

Signed and Sealed this
Thirtieth Day of April, 2019

Andrei Iancu
*Director of the United States Patent and Trademark Office*